(12) United States Patent
Kim

(10) Patent No.: US 11,605,679 B2
(45) Date of Patent: Mar. 14, 2023

(54) DISPLAY DEVICE

(71) Applicant: SAMSUNG DISPLAY CO., LTD., Yongin-si (KR)

(72) Inventor: Jeong Woo Kim, Pyeongtaek-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/476,868

(22) Filed: Sep. 16, 2021

(65) Prior Publication Data

US 2022/0223656 A1 Jul. 14, 2022

(30) Foreign Application Priority Data

Jan. 14, 2021 (KR) .................... 10-2021-0005333

(51) Int. Cl.
*H01L 27/32* (2006.01)
*G06F 3/044* (2006.01)
*G06F 3/041* (2006.01)

(52) U.S. Cl.
CPC .......... *H01L 27/323* (2013.01); *G06F 3/0412* (2013.01); *G06F 3/0446* (2019.05); *G06F 2203/04111* (2013.01)

(58) Field of Classification Search
CPC ....... G02F 1/13338; G06F 2203/04102; G06F 2203/04111; G06F 2203/04112; G06F 3/0412; G06F 3/04164; G06F 3/0443; G06F 3/0446
See application file for complete search history.

(56) References Cited

U.S. PATENT DOCUMENTS

| | | | |
|---|---|---|---|
| 2012/0194474 A1* | 8/2012 | Chang | G06F 3/0443 345/174 |
| 2015/0103027 A1* | 4/2015 | Kuo | G06F 3/0443 345/173 |
| 2015/0362949 A1* | 12/2015 | Chen | G02F 1/13338 345/173 |
| 2018/0032188 A1* | 2/2018 | Park | G06F 3/0412 |
| 2021/0004094 A1 | 1/2021 | Jeong et al. | |

FOREIGN PATENT DOCUMENTS

| | | |
|---|---|---|
| KR | 10-2020-0044264 | 4/2020 |
| KR | 10-2020-0087671 | 7/2020 |
| KR | 10-2021-0004005 | 1/2021 |

\* cited by examiner

*Primary Examiner* — Robin J Mishler
(74) *Attorney, Agent, or Firm* — F. Chau & Associates, LLC

(57) ABSTRACT

A display device including: a display panel; and a touch member on the display panel and including a first touch conductive layer, a second touch conductive layer, and a first touch insulating film between the first touch conductive layer and the second touch conductive layer, wherein the first touch conductive layer includes a first touch connection pattern including a first connecting area and a second connecting area having a larger width than that of the first connecting area, wherein the second touch conductive layer includes first touch sensor patterns connected by the first touch connection pattern, second touch sensor patterns insulated from the first touch sensor patterns, and a second touch connection pattern connecting the second touch sensor patterns with one another, and wherein the second connecting area of the first touch connection pattern is between the first touch sensor pattern and the second touch sensor pattern facing each other.

20 Claims, 16 Drawing Sheets

DISPLAY DEVICE

This application claims priority under 35 U.S.C. 119 to Korean Patent Application No. 10-2021-0005331 filed on Jan. 14, 2021 in the Korean Intellectual Property Office, the disclosure of which is incorporated by reference herein in its entirety.

TECHNICAL FIELD

The present disclosure relates to a display device.

DESCRIPTION OF THE RELATED ART

A display device is an output device for presentation of information in visual form. As information-oriented society evolves, there are increasing demands for display devices. For example, display devices are employed by a variety of electronic devices such as smart phones, digital cameras, laptop computers, navigation devices, and smart televisions.

There is a variety of display device types including: a light-receiving display device such as a liquid-crystal display device, a field emission display device, and a light-emitting display device; an organic light-emitting display device including an organic light-emitting element; an inorganic light-emitting display device including an inorganic light-emitting element such as an inorganic semiconductor; and a light-emitting display device such as a micro-light-emitting display device including a micro-light-emitting element.

These display devices include a display panel for generating and displaying images as well as various input means. Recently, a touch panel that is responsive to a touch input has been widely employed in display devices of smart phones or tablet personal computers (PCs). A touch panel determines whether a touch input is received, and, if the touch input is detected, identifies the coordinates of the position of the touch input.

SUMMARY

Embodiments of the present disclosure provide a display device that can suppress or prevent defects such as a short-circuit between a driving electrode and a sensor electrode of a touch member, and can increase the reliability of the touch member.

According to an embodiment of the present disclosure, there is provided a display device including: a display panel; and a touch member disposed on the display panel and including a first touch conductive layer, a second touch conductive layer, and a first touch insulating film interposed between the first touch conductive layer and the second touch conductive layer, wherein the first touch conductive layer includes a first touch connection pattern including a first connecting area and a second connecting area having a larger width than a width of the first connecting area, wherein the second touch conductive layer includes a plurality of first touch sensor patterns electrically connected by the first touch connection pattern, a plurality of second touch sensor patterns electrically insulated from the plurality of first touch sensor patterns, and a second touch connection pattern electrically connecting the plurality of second touch sensor patterns with one another, and wherein the second connecting area of the first touch connection pattern is disposed between the first touch sensor pattern and the second touch sensor pattern that face each other.

According to an embodiment of the present disclosure, there is provided a display device including: a display panel including a plurality of emission areas for emitting light and a non-emission area surrounding the plurality of emission areas; and a touch member disposed on the display panel and including a first touch sensor pattern, a second touch sensor pattern separated from the first touch sensor pattern and facing the first touch sensor pattern, and a first touch connection pattern disposed between the first touch sensor pattern and the second touch sensor pattern, wherein the first touch sensor pattern, the second touch sensor pattern and the first touch connection pattern are disposed in the non-emission area, and wherein a width of the first touch connection pattern is greater than a width of the first touch sensor pattern and a width of the second touch sensor pattern, and is smaller than a width of the non-emission area located between two adjacent emission areas of the plurality of emission areas.

BRIEF DESCRIPTION OF THE DRAWINGS

The above and other features of the present disclosure will become more apparent by describing in detail embodiments thereof with reference to the attached drawings, in which:

FIG. 9 shows the vicinity of a second area of a first connecting portion according to an embodiment of the present disclosure.

DETAILED DESCRIPTION OF THE EMBODIMENTS

Exemplary embodiments of the present disclosure will now be described more fully hereinafter with reference to the accompanying drawings. This disclosure may, however, be embodied in different forms and should not be construed as limited to the embodiments set forth herein.

It will also be understood that when a layer is referred to as being "on" another layer or substrate, it can be directly on the other layer or substrate, or intervening layers may also be present. The same reference numbers may indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first set)", "second-category second-set)", etc., respectively.

Hereinafter, embodiments of the present disclosure will be described with reference to the accompanying drawings.

Figure 1:
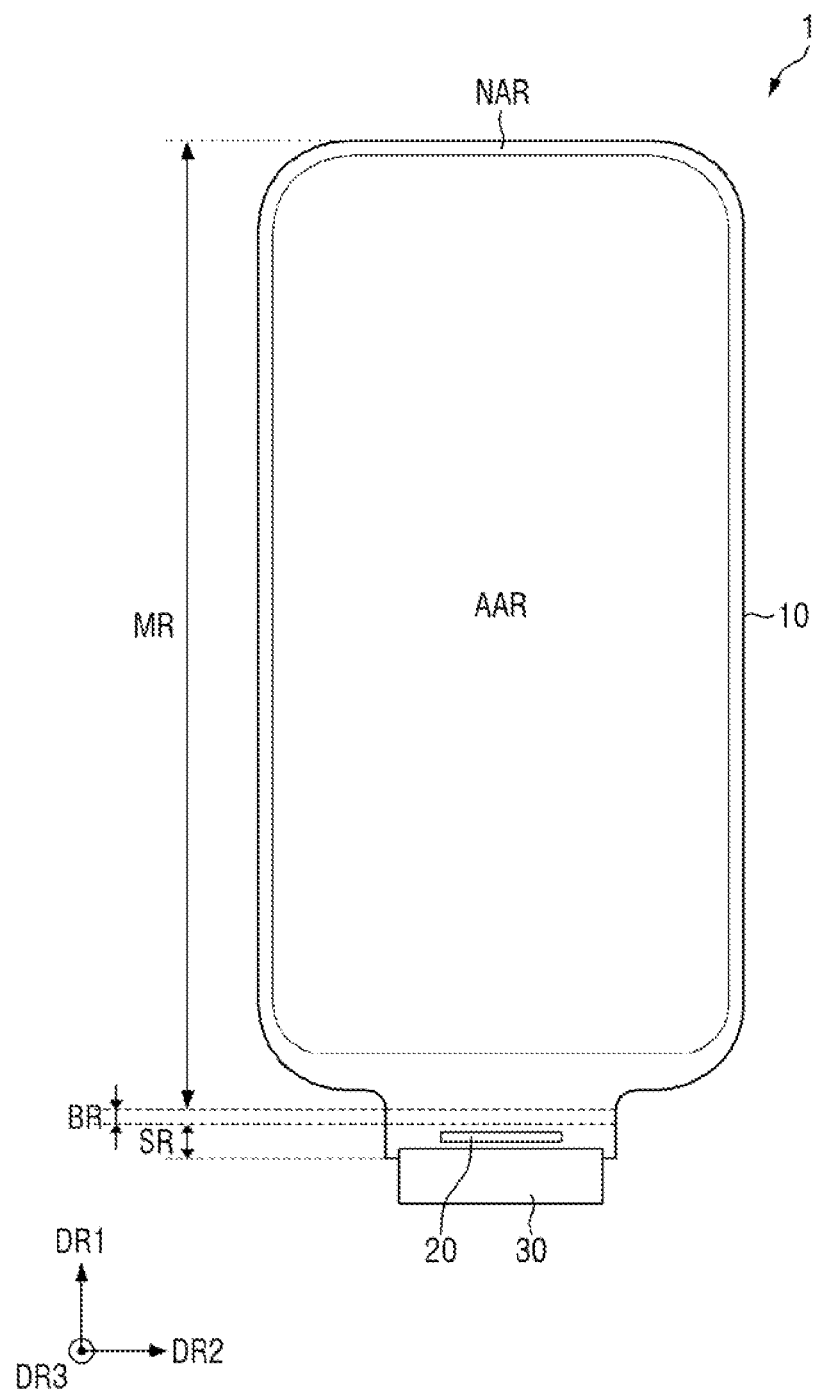
FIG. 1 is a plan view showing the layout of a display device according to an embodiment of the present disclosure.
Figure 2:
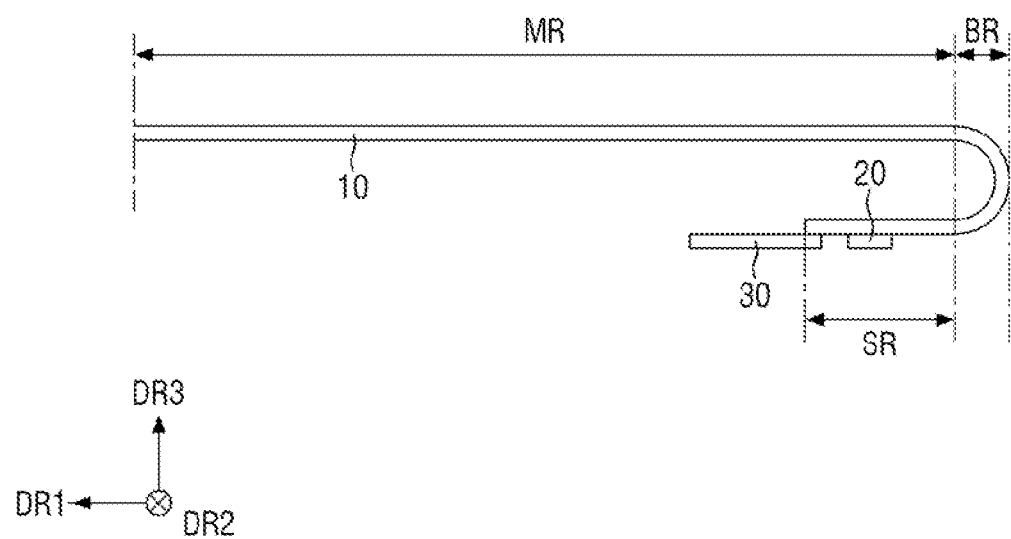
FIG. 2 is a cross-sectional view of a part of a display device according to an embodiment of the present disclosure.

FIG. 1 is a plan view showing the layout of a display device according to an embodiment of the present disclosure. FIG. 2 is a cross-sectional view of a part of a display device according to an embodiment of the present disclosure.

In the embodiments of the present disclosure, a first direction D1 may intersect a second direction D2. In the plan view of FIG. 1, the first direction DR1 is the vertical direction and the second direction DR2 is the horizontal direction. In the following description, a first side along the first direction DR1 may indicate the upper side, a second side along the first direction DR1 may indicate the lower side, a first side along the second direction DR2 may indicate the right side, and a second side along the second direction DR2 may indicate the left side when viewed from above.

A third direction DR3 refers to a direction that crosses the plane where the first direction DR1 and the second direction DR2 are located, and the third direction DR3 is perpendicular to both the first direction DR1 and the second direction DR2. It should be understood that the directions described with respect to the embodiments of the present disclosure are relative directions, and thus, the embodiments are not limited to the directions mentioned.

As used herein, the terms "top", "upper surface" and "upper side" in the third direction DR3 may refer to the display side of a display panel 10, and the terms "bottom", "lower surface" and "lower" may refer to the opposite side of the display panel 10, unless stated otherwise.

Referring to FIGS. 1 and 2, a display device 1 may refer to any electronic device providing a display screen. The display device 1 may include portable electronic devices for providing a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, Internet of Things devices, etc.

The display device 1 includes an active area AAR and a non-active area NAR. In the display device 1, a display area may be the area where images are display, a non-display area may be the area where no image is displayed, and a touch area may be the area where a touch input is sensed. The display area and the touch area may be included in the active area AAR. The display area and the touch area may overlap each other. For example, in the active area AAR, images are displayed and a touch input is sensed.

The shape of the active area AAR may be a rectangle or a rectangle with rounded corners. In the example shown, the shape of the active area AAR is a rectangle that has rounded corners and its sides in the first direction DR1 are longer than its sides in the second direction DR2. It is, however, to be understood that the present disclosure is not limited thereto. For example, the active area AAR may have various shapes such as a rectangular shape with its sides in the second direction DR2 longer than its sides in the first direction DR1, a square shape, other polygonal shapes, a circular shape, and an elliptical shape.

The non-active area NAR is disposed around the active area AAR. The non-active area NAR may be a bezel area. The non-active area NAR may surround all sides (e.g., four sides in FIG. 1) of the active area AAR. It is, however, to be understood that the present disclosure is not limited thereto. For example, the non-active area NAR may not be disposed near the upper side of the active region AAR or near the left or right side thereof.

In the non-active area NAR, signal lines for applying signals to the active area AAR (e.g., display area or touch area) or driving circuits may be disposed. The non-active area NAR may include no display area. Further, the non-active area NAR may include no touch area. In another embodiment of the present disclosure, the non-active area NAR may include a part of the touch area, and a sensor member such as a pressure sensor may be disposed in that part. In some embodiments of the present disclosure, the active area AAR may be identical to the display area where images are displayed, and the non-active area NAR may be identical to the non-display area where no image is displayed.

The display device 1 includes a display panel 10 for providing a display screen. Examples of the display panel 10 may include an organic light-emitting display panel, a micro light emitting diode (LED) display panel, a nano LED display panel, a quantum-dot display panel, a liquid-crystal display panel, a plasma display panel, a field emission display panel, an electrophoretic display panel, an electrowetting display panel, etc. In the following description, an organic light-emitting display panel is employed as an example of the display panel 10, but the present disclosure is not limited thereto. Any other display panel may be employed.

The display panel 10 may include a plurality of pixels. The plurality of pixels may be arranged in a matrix. The shape of each pixel may be, but is not limited to, a rectangle or a square when viewed from above. Each pixel may have a diamond shape having sides inclined with respect to the first direction DR1 or the second direction DR2. Each pixel may include an emission area. Each emission area may have the same shape as or a different shape from the shape of the pixels. For example, when the pixels have a rectangular shape, the shape of the emission area of each of the pixels may have various shapes such as a rectangle, a diamond, a hexagon, an octagon, and a circle. The pixels and the emission areas will be described in detail later.

The display device 1 may further include a touch member for sensing a touch input. The touch member may be implemented as a panel or film separated from the display panel 10 to be attached on the display panel 10 or may be implemented in the form of a touch layer inside the display panel 10. In the following description, although the touch member is provided inside the touch panel to be included in the display panel 10 in the form of the touch layer, it is to be understood that the present disclosure is not limited thereto.

The display panel 10 may include a flexible substrate including a flexible polymer material such as polyimide. Accordingly, the display panel 10 may be curved, bent, folded, or rolled.

The display panel 10 may include a bending region BR. The display panel 10 may be divided into a main region MR located on one side of the bending region BR and a subsidiary region SR located on the other side of the bending region BR.

The display area of the display panel 10 is located in the main region MR. According to an embodiment of the present disclosure, the edge portions of the display area in the main region MR, the entire bending region BR and the entire subsidiary region SR may be the non-display area. It is, however, to be understood that the present disclosure is not limited thereto. The bending region BR and/or the subsidiary region SR may also include the display area.

The main region MR may have a shape similar to the appearance of the display device when viewed from above. The main region MR may be a flat region located in one plane. It is, however, to be understood that the present disclosure is not limited thereto. At least one of the edges of the main region MR except for the edge (e.g., the side) connected to the bending region BR may be bent to form a curved surface or may be bent at a right angle.

When at least one of the edges of the main region MR except for the edge (e.g., the side) connected to the bending region BR is curved or bent, the display area may also be disposed at the edge. It is, however, to be understood that the present disclosure is not limited thereto. The curved or bent edge may be the non-display area that does not display image, or the display area and the non-display area may be disposed together.

The bending region BR is connected to the other side of the main region MR in the first direction DR1. For example, the bending region BR may be connected to the lower shorter side of the main region MR. The width of the bending region BR may be less than the width (e.g., the width of the shorter side) of the main region MR. The portions where the main region MR meets the bending region BR may be cut in an L-shape.

In the bending region BR, the display panel 10 may be bent downward in the thickness direction, e.g., in the direction away from the display surface with a curvature. Although the bending region BR may have a constant radius of curvature, the present disclosure is not limited thereto. It may have different radii of curvature for difference sections. As the display panel 10 is bent at the bending region BR, the surface of the display panel 10 may be reversed. For example, the surface of the display panel 10 facing upward may be bent such that it faces outward at the bending region BR and then faces downward.

The subsidiary region SR is extended from the bending region BR. The subsidiary region SR may be extended in a direction parallel to the main region MR from the end of the bending region. The subsidiary region SR may overlap with the main region MR in the thickness direction of the display panel 10. In other words, the subsidiary region SR may face the main region MR. The width of the subsidiary region SR (e.g., the width in the second direction DR2) may be, but is not limited to being, equal to the width of the bending region BR.

A driver chip IC 20 may be disposed in the subsidiary region SR. The driving chip IC 20 may include an integrated circuit for driving the display panel 10. The integrated circuit may include an integrated circuit for display and/or an integrated circuit for a touch unit. The integrated circuit for a display and the integrated circuit for a touch unit may be provided as separate chips or may be integrated into a single chip.

A pad area may be disposed at the end of the subsidiary region SR of the display panel 10. The pad area may include display signal line pads and touch signal line pads. A drive circuit board FPC 30 may be connected to the pad area at the end of the subsidiary region SR of the display panel 10. The drive circuit board FPC 30 may be a flexible printed circuit board or a film.

Figure 3:
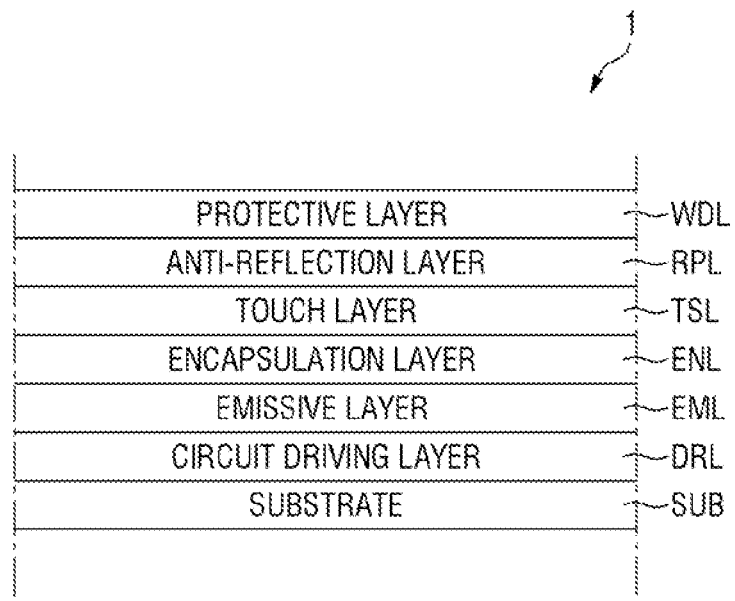
FIG. 3 is a cross-sectional view showing an example of a stack structure of a display device according to an embodiment of the present disclosure.

FIG. 3 is a cross-sectional view showing an example of a stack structure of a display device according to an embodiment of the present disclosure.

Referring to FIG. 3, the display device 1 may include a substrate SUB, a circuit driving layer DRL, an emissive layer EML an encapsulation layer ENL, a touch layer TSL, an anti-reflection layer RPL, and a protective layer WDL, which are stacked on one another.

The substrate SUB may support elements disposed thereon.

The circuit-driving layer DRL may be disposed on the substrate SUB. The circuit driving layer DRL may include a circuit for driving an emissive layer EML of each pixel. The circuit driving layer DRL may include a plurality of thin-film transistors.

The emissive layer EML may be disposed on the circuit driving layer DRL. The emissive layer EML may include an organic emitting layer. The emissive layer EML may emit light with various luminances depending on driving signals transmitted from the circuit driving layer DRL.

The encapsulation layer ENL may be disposed on the emissive layer EML. The encapsulation layer ENL may include an inorganic film or a stack of an inorganic film and an organic film. As another example, a glass or an encapsulation film may be employed as the encapsulation layer ENL.

The touch layer TSL may be disposed on the encapsulation layer ENL. The touch layer TSL may sense a touch input and may perform the functions of the touch member. The touch layer TSL may include a plurality of sensing regions and sensing electrodes.

When the touch layer TSL is included in the display panel 10 (see FIG. 1), the display panel 10 (see FIG. 1) may include the substrate SUB, the circuit driving layer DRL, the emissive layer EML, the encapsulation layer ENL and the touch layer TSL. It is, however, to be understood that the present disclosure is not limited thereto.

The anti-reflection layer RPL may be disposed on the touch layer TSL. The anti-reflection layer RPL may reduce reflection of external light. The anti reflection layer RPL may be attached in the form of a polarizing film. In such case, the anti-reflection layer RPL may polarize the light passing through it, and the anti-reflection layer RPL may be attached on the touch layer TSL through an adhesive layer. The anti-reflection layer RPL in the form of a polarizing film may be eliminated. It is, however, to be understood that the present disclosure is not limited thereto. The anti-reflection layer RPL may be stacked in the form of a color filter layer inside the display panel 10. In such case, the anti-reflection layer RPL may include a color filter that selectively transmits light of a particular wavelength, etc.

The protective layer WDL may be disposed on the anti-reflection layer RPL. The protective layer WDL may include, for example, a window member. The protective layer WDL may be attached on the anti-reflection layer RPL by an optically clear adhesive or the like.

The stack structure of the display panel 10 will be described in more detail later.

Figure 4:
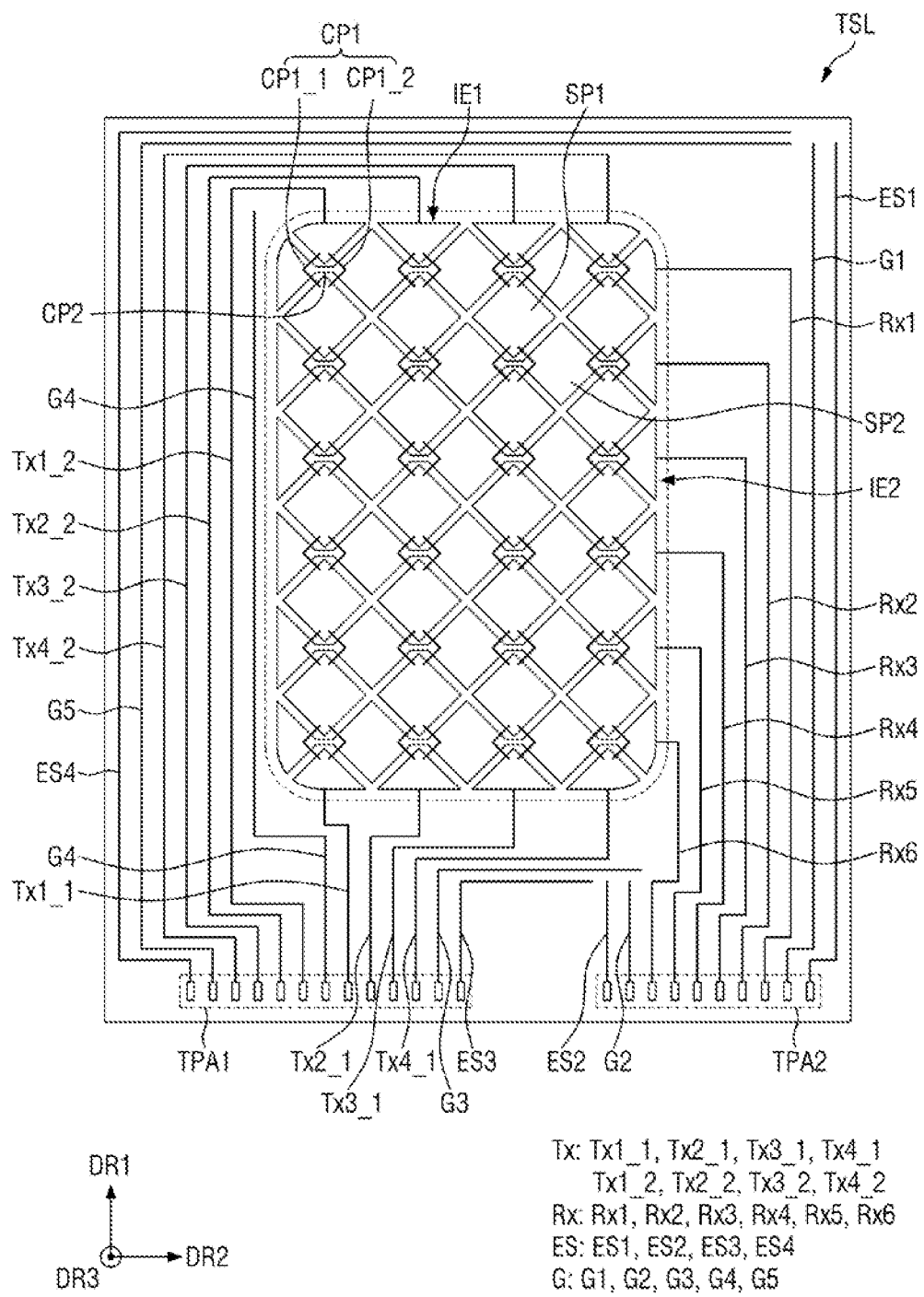
FIG. 4 is a schematic plan view of a touch layer according to an embodiment of the present disclosure.

FIG. 4 is a schematic plan view of a touch layer according to an embodiment of the present disclosure.

Referring to FIG. 4, the touch layer (or touch member) may include a touch area located in the active area AAR and a non-touch area located in the non-active area NAR. Although the touch member is simplified while the non-touch area is exaggerated in FIG. 4 for convenience of illustration, the shape of the touch area and the shape of the non-touch area may be substantially identical to those of the active area AAR and the non-active area NAR described above.

The touch area of the touch member may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. In this embodiment, the first sensing electrodes IE1 are driving electrodes while the second sensing electrodes IE2 are sensing electrodes.

The first sensing electrodes IE1 may be extended in the first direction DR1. The first sensing electrodes IE1 may include a plurality of first sensor portions SP1 (or first touch sensor patterns) arranged in the first direction DR1, and first connecting portions CP1 (or first touch connecting patterns) electrically connecting between adjacent ones of the first sensor portions SP1. The plurality of first sensing electrodes IE1 may be arranged in the second direction DR2.

The second sensing electrodes IE2 may be extended in the second direction DR2. The second sensing electrodes IE2 may include a plurality of second sensor portions SP2 or second touch sensor patterns) arranged in the second direction DR2, and second connecting portions CP2 (or second touch connecting patterns) electrically connecting between adjacent ones of the second sensor portions SP2. The plurality of second sensing electrodes IE2 may be arranged in the first direction DR1.

Although the four first sensing electrodes IE1 and the six second sensing electrodes IE2 are arranged in individual rows and/or columns in FIG. 4, it is to be understood that the numbers of the first sensing electrodes IE1 and the second sensing electrodes IE2 are not limited thereto.

At least some of the first sensor portions SP1 and the second sensor portions SP2 may have a diamond shape. Some of the first sensor portions SP1 and the second sensor portions SP2 may have a truncated diamond shape. For example, all of the first sensor portions SP1 and the second parts SP2 except the first and last ones in the extension direction may have a diamond shape, and each of the first and last ones in the extension direction may have a triangle shape obtained by cutting the diamond shape. The first sensor portions SP1 and the second sensor portions SP2 in the diamond shape may have substantially the same size and shape. The first sensor portions SP1 and the second sensor portions SP2 in the triangle shape may have substantially the same size and shape. It is, however, to be understood that the present disclosure is not limited thereto. The first sensor portions SN and the second sensor portions SP2 may have a variety of shapes and sizes.

The first sensor portions SP1 of the first sensing electrodes IE1 and the second sensor portions SP2 of the second sensing electrodes IE2 may each include a planar pattern or a mesh pattern. It is, however, to be understood that the present disclosure is not limited thereto. The first sensor portions SP1 and the second sensor portions SP2 may have a variety of patterns.

Figure 5:
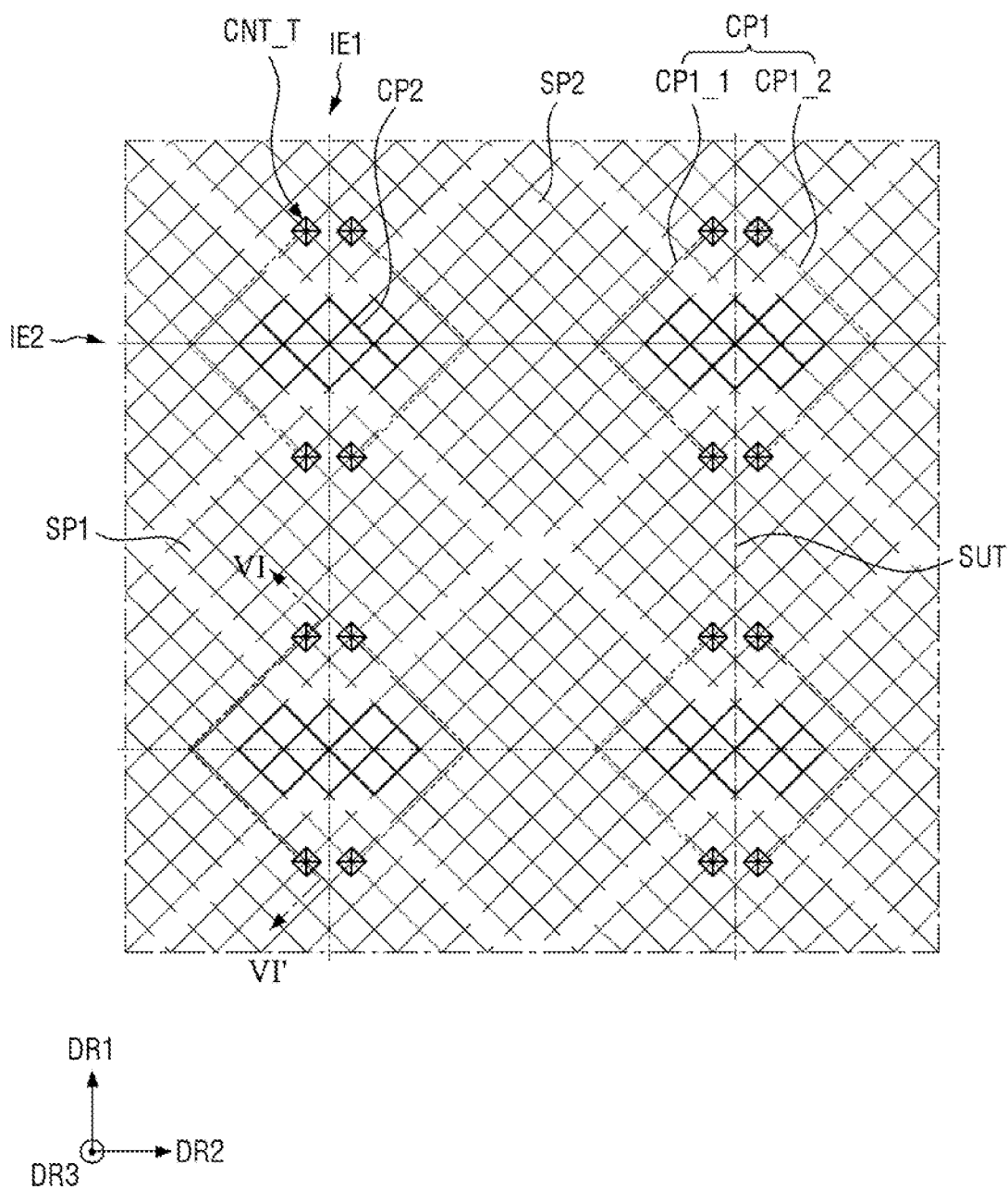
FIG. 5 is an enlarged view of a part of a touch region of FIG. 4.
Figure 7:
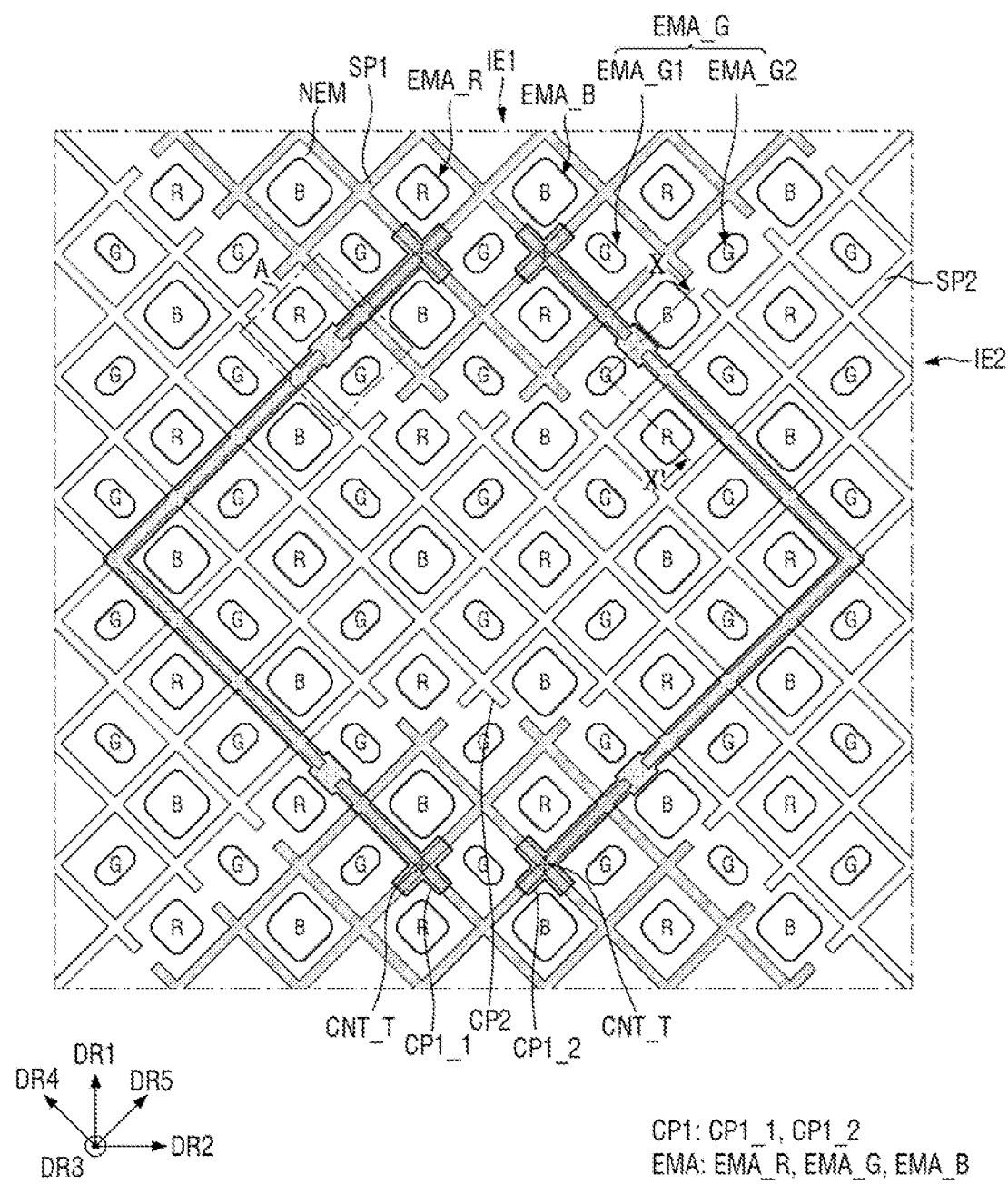
FIG. 7 is a diagram showing the arrangement pixels and a touch member in a mesh pattern in a display area according to an embodiment of the present disclosure.

When the first sensor portions SP1 and the second sensor portions SP2 include a planar pattern, the first sensor portions SP1 and the second sensor portions SP2 may be formed as a transparent conductive layer. When the first sensor portions SP1 and the second sensor portions SP2 include a mesh pattern disposed along the non-emission areas as illustrated in FIGS. 5 and 7, an opaque, low-resistance metal may be employed without interfering with the propagation of the emitted light. In the following description, the first sensor portions SN and the second sensor portions SP2 each include a mesh pattern. It is, however, to be understood that the present disclosure is not limited thereto.

Each of the first connecting portions CP1 may connect a vertex of the diamond or triangle shape of a first sensor portion SP1 with that of an adjacent first sensor portion SP1. Each of the second connecting portions CP2 may connect a vertex of the diamond or triangle shape of a second sensor portion SP2 with that of an adjacent second sensor portion SP2. The width of the first connecting portions CP1 and the second connecting portions CP2 may be smaller than the width of the first sensor portions SP1 and the second sensor portions SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer disposed on a different layer at the intersections, such that the first sensing electrodes IE1 can be insulated from the second sensing electrodes IE2. The first sensing electrodes IE1 can be connected to one another by the first connecting portions CP1 while the second sensing electrodes IE2 can be connected to one another by the second connecting portions CP2. In this case, the first and second sensing electrodes IE1 and IE2 are insulated from each other while intersecting each other. For example, the first connecting portions CP1 and/or the second connecting portions CP2 may be located on a different layer from the first sensing electrode IE1 and the second sensing electrode IE2.

For example, the first sensor portions SP1 of the first sensing electrodes IE1 and the second sensor portions SP2 of the second sensing electrodes IE2 may be formed as a conductive layer located on the same layer, and the first sensor portions SP1 and the second sensor SP2 may neither intersect nor overlap with each other. The adjacent ones of the first sensor portions SP1 and second sensor portions SP2 may be physically separated from each other.

The second connecting portions CP2 may be formed as the same conductive layer as the second sensor portions SP2 and may connect the adjacent ones of the second sensor portions SP2. A first sensor portion SP1 of a first sensing electrode IE1 is physically separated from an adjacent sensor portion SP1 with respect to the area where a second connecting portion CP2 passes. The first connecting portions CP1 connecting the first sensor portions SP1 with one another may be formed as a different conductive layer from the first sensor portions SP1 and may traverse the area of the second sensing electrodes IE2. Each of the first connecting portions CP1 may be electrically connected to the respective first sensor portions SP1 by a contact.

There may be more than one first connecting portion CP1. For example, although not limited thereto, each of the first connecting portions CP1 may include a first connecting portion CP1_1 (or a first sub-connecting portion) which overlaps and passes an adjacent second sensing electrode IE2 on one side, and another first connecting portion CP1_2 (or a second sub connecting portion) which overlaps and passes another adjacent second sensing electrode IE2 on the other side. For example, as shown in FIG. 4, the first sub-connecting portion CP1_1 may be located at a lower side of adjacent first sensor portions SP1 and the second sub-connecting portion CP1_2 may be located at a lower right side of the adjacent first sensor portions SP1. As more than one first connecting portion CP1 are used to connect adjacent ones of the first sensor portions SP1, it is possible to prevent disconnection of the first sensing electrodes IE1 even if any of the first connecting portions CP1 is broken by static electricity or the like.

The first sensor portions SP1 and the second sensor portions SP2 adjacent to each other may form a sensing unit SUT (see FIG. 5). For example, halves of two adjacent first sensor portions SPA and halves of two adjacent second sensor portions SP2 may form a square or a rectangle, with respect to the intersection between the first sensing electrodes IE1 and the second sensing electrodes IE2. The area defined by the halves of the adjacent two first sensor portions SP1 and halves of the two adjacent second sensor portions SP2 may be a sensing unit SUT. A plurality of sensing units SUT may be arranged in row and column directions.

In each of the sensing units SUT, the capacitance value between the adjacent first sensor portions SP1 and the second sensor portions SP2 is measured to determine whether or not a touch input is made, and if a touch input is made, the position may be obtained as touch input coordinates. For example, a touch may be sensed by, for example, measuring mutual capacitance.

Each sensing unit SUT may be larger than the size of a pixel. For example, each sensing unit SUT may have an area equal to the area occupied by a plurality of pixels. The length of a side of the sensing unit SUT may be in the range of, but is not limited to, 4 to 5 mm.

A plurality of touch signal lines is disposed outside the touch area. The plurality of touch signal lines may be disposed in the non-active area NAR (see FIG. 1). The touch signal lines may be extended from touch pad areas TPA1 and TPA2 located in the subsidiary region SR (see FIG. 1) to the non-active area NAR (see FIG. 1) of the main region MR (see FIG. 1) through the bending region BR (see FIG. 1).

The touch signal lines include touch driving lines Tx and touch sensing lines Rx. In an embodiment of the present disclosure, the touch signal lines may further include touch ground lines G and/or touch antistatic lines ES.

The touch driving lines Tx are connected to the first sensing electrodes In an embodiment of the present disclosure, a plurality of touch driving lines Tx may be connected to a single first sensing electrode IE1. For example, the touch driving lines Tx may include first touch driving lines Tx1_1, Tx2_1, Tx3_1 and Tx4_1 connected to the lower end of the first sensing electrodes IE1, and second touch driving lines Tx1_2, Tx2_2, Tx3_2 and Tx4_2 connected to the upper end of the first sensing electrodes IE1. The first touch driving lines Tx1_1, Tx2_1, Tx3_1 and Tx4_1 may be extended from pads of the touch signal line area TPA1 as indicated by the upper arrow in the first direction DR1 and may be connected to the lower end of the first sensing electrodes IE1. The second touch driving lines Tx1_2, Tx_2, Tx3_2 and Tx4_2 may be extended from the touch signal line pad area TPA1 as indicated by the upper arrow in the first direction DR1 and may go along the left edge of the touch area to be connected to the upper end of the first sensing electrodes IE1.

The touch sensing lines Rx are connected to the second sensing electrodes IE2. In an embodiment of the present disclosure, a single touch sensing line Rx may be connected to a single second sensing electrode IE2. The touch sensing lines Rx1, Rx2, Rx3 Rx4, Rx5 and Rx6 may be extended from pads of the touch signal line area TPA2 as indicated by the upper arrow in the first direction DR1 and may go along the right edge of the touch area to be connected to the right end of the second sensing electrodes IE2.

The touch antistatic lines ES may be disposed at the outermost portion of the touch signal lines. For example, the touch antistatic lines ES may be disposed along at least three edges of the touch layer TSL. In an embodiment of the present disclosure, the touch antistatic lines may include a first touch antistatic line ES1, a second touch antistatic line ES2, a third touch antistatic line ES3, and a fourth touch antistatic line ES4. The first to fourth touch antistatic lines ES1, ES2, ES3 and ES4 may surround the touch area and the signal lines in a ring shape.

The first touch antistatic line ES1 may be a touch signal line located on the right side of the touch area and be the closest signal line to the right outer side of the touch area. The second touch antistatic line ES2 may be a touch signal line located on the right side of the touch area and near an inner portion of the touch area. The third touch antistatic line ES3 may be a touch signal line located to the left of the second touch antistatic line ES2 and extend in the second direction DR2 along the lower side of the touch area to the second touch antistatic line ES2. The fourth touch antistatic line ES4 may be a touch signal line located on the left side of the touch area and be the closest signal line to the left outer side of the touch area and further extend in the second direction DR2 on the upper side of the touch area towards the right side of the touch area.

The touch ground lines G may be disposed between the signal lines. The touch ground lines G may include a first touch ground line G1, a second touch ground line G2, a third touch ground line G3, a fourth touch ground line G4 and a fifth touch ground line G5. The first touch ground line G1 may be disposed between the touch sensing lines Rx and the first touch antistatic line ES1. The second touch ground line G2 may be disposed between the second touch antistatic line ES2 and the touch sensing lines Rx. The third touch ground line G3 may be disposed between the first touch driving lines Tx1_1, Tx2_1, Tx3_1 and Tx4_1 and the third touch antistatic line ES3. The fourth touch ground line G4 may be disposed between the first touch driving lines Tx_1, Tx2_, Tx3_1 and Tx4_1 and the second touch driving lines Tx1_2, Tx2_2, Tx3_2 and Tx4_2. The fifth touch ground line G5 may be disposed between the second touch driving lines Tx1_2, Tx2_2, Tx3_2 and Tx4_2 and the fourth touch antistatic line ES4.

Figure 6:
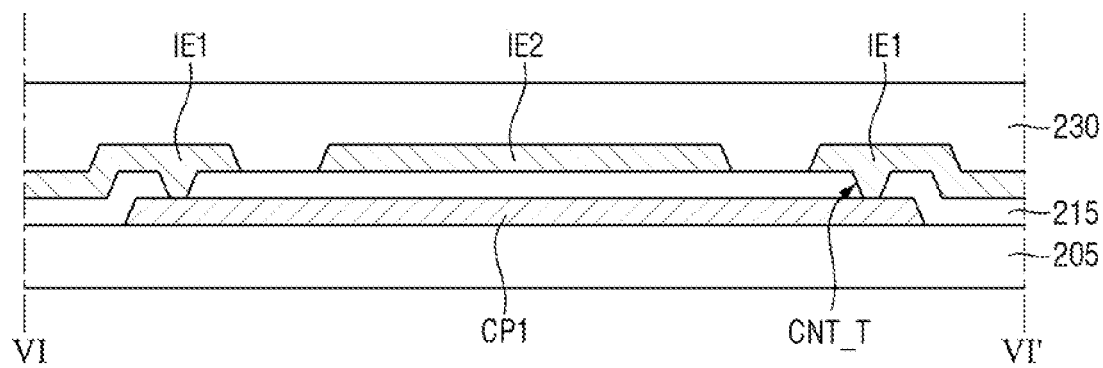
FIG. 6 is a cross-sectional view taken along line VI-VI' of FIG. 5.

FIG. 5 is an enlarged view of a part of the touch area of FIG. 4. FIG. 6 is a cross-sectional view taken along line VI-VI' of FIG. 5.

Referring to FIGS. 4 to 6, the touch member may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

For example, the first touch conductive layer 210 is disposed on the base layer 205. The first touch conductive layer 210 is covered by the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 covers and protects the second touch conductive layer 220.

The base layer 203 may include an inorganic insulating material. For example, the base layer 205 may include a silicon nitride layer, a silicon oxynitride layer, a silicon oxide layer, a titanium oxide layer, or an aluminum oxide layer. In some embodiments of the present disclosure, the base layer 205 may be replaced with a second inorganic layer 193 (see FIG. 10) funning a thin encapsulation layer to be described later.

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include a transparent conductive oxide such as indium tin oxide (ITO) indium zinc oxide (IZO), zinc oxide (ZnO) and indium tin zinc oxide (ITZO), a conductive polymer such as PEDOT, metal nanowire, graphene etc. As described above, when the first touch conductive layer 210 and the second touch conductive layer 220 are disposed on the non-emission area, they do not interfere with the propagation of the emitted light even if they are an opaque, low-resistance metal.

The first touch conductive layer 210 and/or the second touch conductive layer 220 may include a multi-layered conductive layer. For example, the first touch conductive layer 210 and/or the second touch conductive layer 220 may have a three-layer structure of titanium/aluminum/titanium.

In an embodiment of the present disclosure, the fast connecting portions CP1 may be formed as the first touch conductive layer 210 while the first sensor portions SP1, the second sensor portions SP2 and the second connecting portions CP2 may be formed as the second touch conductive layer 220. For example, the first touch conductive layer 210 may include the first connecting portion CP1, and the second touch conductive layer 220 may include the first sensor portion SP1, the second sensor portion SP2, and the second connecting portion CP2. It is, however, to be understood that the present disclosure is not limited thereto. For example, the first connecting portions CP1 may be formed as the second touch conductive layer 220 while the first and second sensor portions SP1 and SP2 and the second connecting portions CP2 may be formed as the first touch conductive layer 210. The touch signal lines may be formed as either the first touch conductive layer 210 or the second touch conductive layer 220. Alternatively, the touch signal lines may be formed as the first touch conductive layer 210 and the second touch conductive layer 220 connected by a contact.

The touch conductive layers forming the elements of the sensing electrodes and the signal tines may be modified in a variety of ways.

The first touch insulating layer 215 and the second touch insulating layer 230 may include an inorganic material or an organic material. In an embodiment of the present disclosure, the first touch insulating layer 215 or the second touch insulating layer 230 may include an inorganic material and the other may include an organic material. According to an embodiment of the present disclosure, the first touch insulating layer 215 may include a silicon nitride layer, a silicon oxynitride layer, a silicon oxide layer, a titanium oxide layer, an aluminum oxide layer, etc. The second touch insulating layer 230 include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin. When the second touch insulating layer 230 includes an organic material, it may have a substantially that upper surface.

The first touch insulating layer 215 may include a contact hole CNT_T. The first touch conductive layer 210 (e.g., the first connecting portion CP1) and a part of the second touch conductive layer 220 (e.g., the first sensor portion SP1) may be electrically to each other through the contact hole CNT_T. The first sensor portions SP1 of the first sensing electrodes IE1 separated by the second sensing electrodes IE2 may be electrically connected with each other by the first touch conductive layer 210 (e.g., the first connecting portions CP1).

In addition, an insulating layer may be further disposed on the second touch conductive layer 220. The insulating layer may include an inorganic material or an organic material. When the insulating layer includes an organic material, it may have a flat upper surface.

FIG. 7 is a diagram showing the arrangement relationship between the pixels and the touch member m a mesh pattern in the display area according to an embodiment of the present disclosure.

Referring to FIG. 7, the display area of the active area AAR includes a plurality of pixels. Each of the pixels includes an emission area EMA. The emission area EMA overlaps with an opening of a pixel defining layer 126 (see FIG. 10) and may be defined thereby. A non-emission area NEM is disposed between the emission area EMA of a pixel and the emission area EMA of another pixel. The non-emission area NEM overlaps with the pixel defining layer 126 (see FIG. 10) and may be defined thereby. The non-emission area NEM may surround the emission area EMA. The non emission area NEM has a lattice shape or a mesh shape arranged along the diagonal directions (a fourth direction DR4 or a fifth direction DR5) intersecting with the first direction DR1 and the second direction DR2 when viewed from above.

The pixels may include first color pixels (e.g., red pixels), second color pixels (e.g., blue pixels), and third color pixels (e.g., green pixels). The shape of the emission area EMA of each color pixel may be an octagon, a square or a diamond with rounded corners. It is, however, to be understood that the present disclosure is not limited thereto. The shape of each emission area EM A may be a circle, a diamond, or other polygons with or without rounded corners.

In an embodiment of the present disclosure, the emission area EMA_R of the first color pixel and the emission area EMA_B of the second color pixel may have similar shapes such as a diamond shape with rounded corners. The emission area EMA_B of the second color pixel may be larger than the emission area EMA_R of the first color pixel. In other words, the non-emission area NEM of the first color pixel may be larger than the non-emission area NEM of the second color pixel.

The emission area EMA_G of the third color pixel may be smaller than the emission area EMA_R of the first color pixel. The emission area EMA_G of the third color pixel may have an octagon shape that is inclined in diagonal directions (e.g., the fourth direction DR4 and the fifth direction DR5) and has the maximum width in the inclined directions. The third color pixels may include third color pixels having an emission area EMA_G1 inclined in a first diagonal direction (e.g., the fourth direction DR4), and third color pixels having an emission area EMA_G2 inclined in a second diagonal direction (e.g., the fifth direction DR5).

The color pixels may be arranged in a variety of ways. In an embodiment of the present disclosure, the first color pixels (e.g., red pixels) and the second color pixels (e.g., blue pixels) may be alternately arranged in the second direction DR2 to form a first row, while third color pixels green pixels) may be arranged in the second direction DR2 to form a second row next to the first row. The pixels belonging to the second row (the third color pixels) may be arranged in a staggered manner in the second direction DR2 with respect to the pixels belonging to the first row. For example, in the second row, the third color pixels that are inclined in the first diagonal direction and the third color pixels that are inclined in the second diagonal direction may be alternately arranged in the second direction DR2. The number of the third color pixels belonging to the second row may be twice the number of the first color pixels or the number of the second color pixels belonging to the first row.

In the third row, the color pixels of the same colors as the first row may be arranged in the reversed order. For example, in a column of the first row where a first color pixel is disposed, a second color pixel is disposed in the same column of the third row. In a column of the first row where a second color pixel is disposed, a first color pixel is disposed in the same column of the third row. In the fourth row, the third color pixels are arranged like the second row but they may be arranged in the reversed order in view of the shapes inclined with respect to the diagonal directions. For example, in a column of the second row where a third color pixel inclined in the first diagonal direction is disposed, a third color pixel inclined in the second diagonal direction is disposed in the same column of the fourth row. In a column of the second row where a third color pixel inclined in the second diagonal direction is disposed, a third color pixel inclined in the first diagonal direction is disposed in the same column of the fourth row.

The arrangement of the first to fourth rows may be repeated in the first direction DR1. It is to be understood that the arrangement of the pixels is not limited to the above example.

The first sensor portion SP1, the second sensor portion SP2, the first connecting portion CP1 and the second connecting portion CP2 may be disposed in the non-emission area NEM. The first sensor portion SP1, the second sensor portion SP2 and the first connecting portion CP1 may include a mesh pattern. In other words, the first sensor portion SP1, the second sensor portion SP2 and the first connecting portion CP1 may be formed in a mesh pattern. Further, the second connecting portion CP2 may include a mesh pattern. In other words, the first sensor portion SP1, the second sensor portion SP2 and the first connecting portion CP1 have a lattice pattern or a mesh pattern in which they are arranged along the diagonal directions (e.g., the fourth direction DR4 or the fifth direction DR5) intersecting with the first direction DR1 and the second direction DR2 when viewed from above.

The first sensor portion SP1, the second sensor portion SP2, the first connecting portion CP1 and the second connecting portion CP2 may be disposed in the non-emission area NEM along the borders of pixels. The first sensor portion SP1, the second sensor portion SP2, the first connecting portion CP1 and the second connecting portion CP2 may not overlap with the emission area EMA. The width of the first sensor portion SP1, the second sensor portion SP2, the first connecting portion CP1 and the second connecting portion CP2 may be smaller than the width of the non-emission area NEM.

When the first sensor portion SP1, the second sensor portion SP2 and the first connecting portion CP1 include a mesh pattern, the areas exposed by the first sensor portion SP1, the second sensor portion SP2 and the first connecting portion CP1 may have, but are not limited to, a substantially rhombus shape.

The first sensor portion SP1, the second sensor portion SP2 and the first connecting portion CP1 may expose the emission area EMA. In other words, the mesh pattern of each of the first sensor portion SP1, the second sensor portion SP2 and the first connecting portion CP1 may expose the emission area EMA. The size of the areas exposed by the mesh patterns may be all equal, but may be different depending on or irrespective of the size of the emission area EMA exposed by the mesh patterns. In addition, although one exposed area corresponds to one emission area EMA in the drawings, the present disclosure is not Limited thereto. One exposed area may correspond to two or more emission areas EMA.

The first sensor portion SP1 and the second sensor portion SP2 may overlap most areas of the first connecting portion CP1. The first sensor portion SP1 and the second sensor portion SP2 may cover most areas of the first connecting portion CP1. In other words, the first connecting portion CP1 may be disposed across the area in which the first sensor portion SP1 is disposed and the area in which the second sensor portion SP2 is disposed. In such case, the first sensor portion SP1 and the second sensor portion SP2 may overlap with the first connecting portion CP1 except for the area where they are disconnected from each other. Accordingly, even though the first connecting portion CP1 is formed as a conductive layer different from the first sensor portion SP1 and the second sensor portion SP2, it is possible to suppress or prevent a defect that the first connecting portion CP1 is perceived.

The first connecting portion CP1 may include a first connecting area CA1 (see FIG. 8) and a second connecting area CA2 (see FIG. 8) having different line widths. The second connecting area CA2 (see FIG. 8) having a relatively large width may be disposed in an area where the first sensor portion SP1 and the second sensor portion SP2 adjacent to each other are spaced apart from each other, and thus, it is possible to suppress or prevent defects such as a short-circuit between the first sensor portion SP1 and the second sensor portion SP2. More detailed description thereon will be given below.

An embodiment of the present disclosure provides a display device 1 including: a display panel 10; and a touch member disposed on the display panel and including a first touch conductive layer 210, a second touch conductive layer 220, and a first touch insulating film 215 interposed between the first touch conductive layer 210 and the second touch conductive layer 220. The first touch conductive layer 210 includes a first touch connection pattern CP1 comprising a first connecting area CA1 and a second connecting area CA2 having a larger width than a width of the first connecting area CA1. The second touch conductive layer 220 includes a plurality of first touch sensor patterns SP1 electrically connected by the first touch connection pattern CP1, a plurality of second touch sensor patterns SP2 electrically insulated from the plurality of first touch sensor patterns SP1, and a second touch connection pattern CP2 electrically connecting the plurality of second touch sensor patterns SP2 with one another, and the second connecting area CA2 of the first touch connection pattern CP1 is disposed between the first touch sensor pattern SP1 and the second touch sensor pattern SP2 that face each other.

Figure 8:
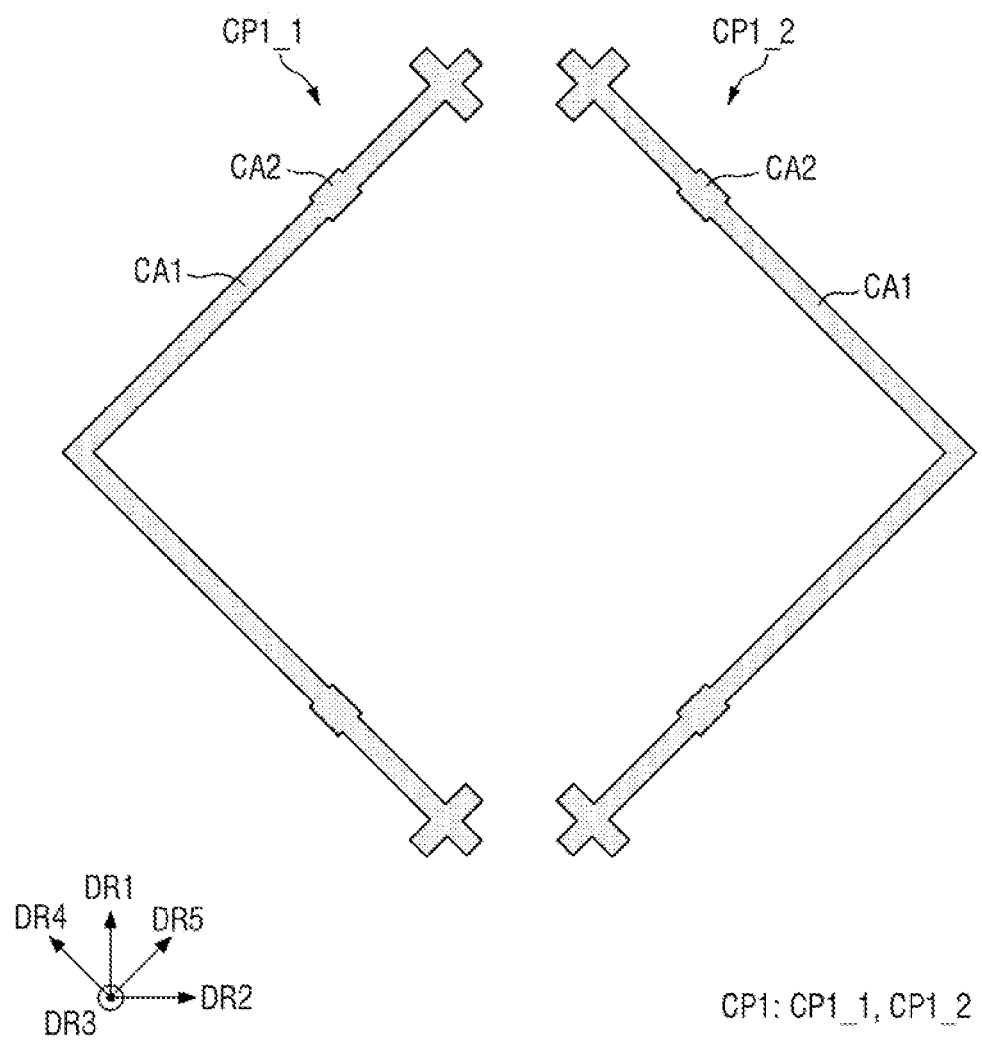
FIG. 8 is a plan view of a first connecting portion according to an embodiment of the present disclosure.
Figure 9:
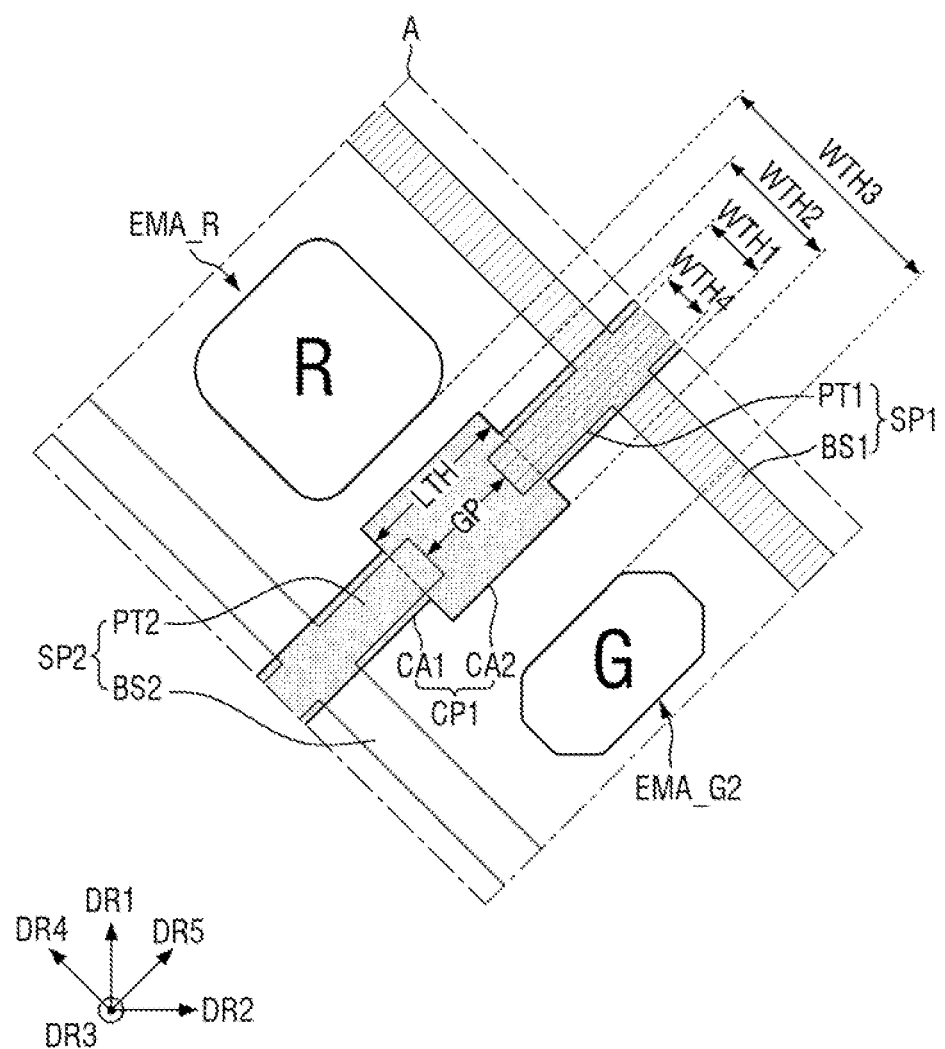
FIG. 9 is an enlarged view of area A of FIG. 7.

FIG. 8 is a plan view of a first connecting portion according to an embodiment of the present disclosure. FIG. 9 is an enlarged view of area A of FIG. 7. FIG. 9 shows the vicinity of a second area CA2 of a first connecting portion CP1 according to an embodiment.

Referring to FIGS. 7 to 9, the first connecting portion CP1 may include a first connecting area CA1 and a second connecting area CA2 having different line widths. The line width of the second connecting area CA2 may be larger than the line width of the first connecting area CA1. Each of the first sub-connecting portion CP1_1 and the second sub-connecting portion CP1_2 of the first connecting portion CP1 may include the first connecting area CA1 and the second connecting area CA2. The following description on the first connecting area CA1 and the second connecting area CA2 of the first connection portion CP1 can be equally applied to each of the first sub-connecting portion CP1_1 and the second sub-connecting portion CP1_2.

For example, the first sensor portion SP1 may include a first base BS1 and a first protrusion PT1, and the second sensor portion SP2 may include a second base BS2 and a second protrusion PT2.

The first protrusion PT1 may protrude from the first base BS1 in the first diagonal direction (e.g., the fourth direction DR4) or the second diagonal direction (e.g., the fifth direction DR5). For example, the first protrusion PT1 may form a part of a mesh pattern of the first sensor portion SP1 and may protrude in the second diagonal direction (e.g. the fifth direction DR5) from the first base BS1 extended in the first diagonal direction (e.g., the fourth direction DR4). The first protrusion PT1 may protrude toward the second sensor portion SP2. In other words, the first protrusion PT1 may face the second protrusion PT2.

The second protrusion PT2 may protrude from the second base BS2 in the first diagonal direction (e.g., the fourth direction DR4) or the second diagonal direction (e.g., the fifth direction DR5). For example, the second protrusion PT2 may form a part of a mesh pattern of the second sensor portion SP2 and may protrude in the second diagonal direction (e.g., the fifth direction DR5) from the second base BS2 extended in the first diagonal direction (e.g., the fourth direction DR4). The second protrusion PT2 may protrude toward the first sensor portion SP1. For example, a gap may be formed directly between the first protrusion PT1 and the second protrusion PT2.

The plurality of first sensor portions SP1 may be disposed to at least partially face at least a part of the plurality of second sensor portions SP2 when viewed from the top or above. In other words, the first protrusion PT1 of the first sensor portion SP1 and the second protrusion PT2 of the second sensor portion SP2 protruding toward each other may be separated from each other and electrically insulated from each other, and the first protrusion PT1 and the second protrusion PT2 may face each other when viewed from the top or above.

The side surfaces of the second connecting area CA2 of the first connecting portion CP1 may be disposed more to the outside than the side surfaces of the first protrusion PT1 and the side surfaces of the second protrusion PT2. For example, the second connecting area CA2 may be wider than the second protrusion PT2 in the fourth direction DR4. Herein, the side surfaces of the second connecting area CA2, the side surfaces of the first protrusion PT1 and the side surfaces of the second protrusion PT2 may refer to the surfaces disposed on one side and the opposite side in the direction perpendicular to their extension direction. For example, the side surfaces of each of the second connecting area CA2, the first protrusion PT1 and the second protrusion PT2 extended in the second diagonal direction (the fifth direction DR5) may refer to the surfaces disposed on one side and the opposite side in the first diagonal direction (the fourth direction DR4 of each of the second connecting area CA2, the first protrusion PT1 and the second protrusion PT2.

In addition, the second connecting portion CP2 may include a base and a protrusion, which are substantially identical to the base BS2 and the second protrusion PT2 of the second sensor portion SP2 described above, respectively.

The first connecting area CA1 may overlap the first sensor portion SP1 or the second sensor portion SP2. At least a part of the second connecting area CA2 may be exposed by the first sensor portion SP1 and the second sensor portion SP2 separated from each other. At least a part of the second connecting area CA2 may overlap neither the first sensor portion SP1 nor the second sensor portion SP2. In other words, at least a part of the second connecting area CA2 may be disposed between the first sensor portion SP1 and the second sensor portion SP2 when viewed from the top. For example, at least a part of the second connecting area CA2 may be disposed between the first protrusion PT1 of the first sensor portion SP1 and the second protrusion PT2 of the second sensor portion SP2 facing each other when viewed from the top. It is, however, to be understood that the present disclosure is not limited thereto. For example, the second connecting area CA2 may be disposed between the first sensor portion SP1 and the second connecting portion CP2 separated from each other when viewed from the top.

The second connecting area CA2 may be disposed between the emission areas EMA adjacent to each other. The second connecting area CA2 may be disposed between the emission areas EMA arranged along the first diagonal direction (e.g., the fourth direction DR4), or between the emission areas EMA arranged along the second diagonal direction (e.g., the fifth direction DR5). For example, the second connection area CA2 may be disposed between an emission area EMA_R of a first color pixel and an emission area EMA_G2 of a third color pixel adjacent to each other along the first diagonal direction (the fourth direction DR4).

The first connecting area CA1 may have a first width WTH1, and the second connecting area CA2 may have a second width WTH2. For example, a line width of the first connecting area CA1 may have the first width WTH1, and a line width of the second connecting area may have the second width WTH2. The second width WTH2 may be larger than the first width WTH1. Although not limited thereto, for example, the second width WTH2 may be in a range of 1.1 to 10 times, 1.1 to 3 times, or 1.2 to 1.5 times the first width WTH1.

The size of the first width WTH1 may be, for example, 3.0 μm, 1.0 μm to 5.0 μm, 2.0 μm to 4.0 μm, or 2.5 μm to 3.5

μm. It is, however, to be understood that the present disclosure is not limited thereto. The size of the second width WTH2 may be, for example, 4.0 μm, 2.0 μm to 10.0 μm, 2.0 μm to 8.0 μm, 2.0 μm to 6.0 μm, or 3.5 μm to 4.5 μm. It is, however, to be understood that the present disclosure is not limited thereto.

The first width WTH1 and the second width WTH2 may refer to a width in a direction perpendicular to the direction in which the first connection area CA1 and the second connection area CA2 are extended. For example, the first width WTH1 of the first connecting area CA1 of the first connecting portion CP1 extended in the second diagonal direction (e.g., the fifth direction DR5) may refer to the width in the first diagonal direction (the fourth direction DR4), and the second width WTH2 of the second connecting area CA2 may refer to the width in the first diagonal direction (e.g., the fourth direction DR4).

When each of the first width WTH1 and the second width WTH2 has a size within the above ranges, the first sensor portion SP1 and the second sensor portion SP2 can be reliably spaced apart from each other even if the first sensor portion SP1 and the second sensor portion SP2 are misaligned with the first connecting portion CP1. Thus, despite the process margin of the first sensor portion SP1 and the second sensor portion SP2 and the process margin of the first connecting portion CP1, the first sensor portion SP1 and the second sensor portion SP2 can be spaced apart from each other reliably.

For example, even if a conductive layer in which the first sensor portion SP1 and the second sensor portion SP2 are formed (e.g., the second conductive layer 220 (see FIG. 6) before patterning) and/or a conductive layer in which the first connecting portion CP1 is formed (e.g., the first conductive layer 220 (see FIG. 6) before patterning) fail to be disposed at their intended locations due to misalignment or process margin, at least the part of the conductive layer where the first sensor portion SP1 and the second sensor portion SP2 are disconnected may be disposed in the second connecting area CA2. In other words, even if the conductive layer in which the first sensor portion SP1 and the second sensor portion SP2 are formed (e.g., the second conductive layer 220 (see FIG. 6) before patterning) and/or the conductive layer in which the first connecting portion CP1 is formed (e.g., the first conductive layer 220 (see FIG. 6) before patterning) are moved on one side or the opposite side in the first diagonal direction (e.g., the fourth direction DR4) due to misalignment and/or process margin, at least the part of the conductive layer where the first sensor portion SP1 and the second sensor portion SP2 are disconnected will still be disposed in the second connecting area CA2.

In such a case, at least the part of the conductive layer where the first sensor portion SP1 and the second sensor portion SP2 are disconnected may have substantially the same thickness in the thickness direction (e.g., the third direction DR3). When the area where the first sensor portion SP1 and the second sensor portion SP2 are disconnected is etched, since the area has substantially the same thickness, it is possible to suppress or prevent the conductive layer from remain in that area.

Accordingly, the first sensor portion SP1 and the second sensor portion SP2 can be spaced apart from each other reliably, and the first sensor portion SP1 and the second sensor portion SP2 can be reliably electrically insulated from each other. In other words, since the first sensor portion SP1 and the second sensor portion SP2 are not electrically connected to each other, they may not be connected through a capacitor. Thus, it is possible to suppress or prevent a short circuit between the first sensor portion SP1 and the second sensor portion SP2. Moreover, the reliability of the touch member and the reliability of the display panel including the touch member can be increased.

The non-emission area NEM between the emission areas IEMS adjacent to each other may have a third width WTH3. The third width WTH3 may refer to the distance between the emission areas EMA adjacent to each other. The second width WTH2 may be smaller than the third width WTH3. Although not limited thereto, for example, the second width WTH2 may be in a range of 0.1 to 0.99 times, 0.2 to 0.8 times, or 0.3 to 0.5 times the third width WTH3.

When the second width WTH2 has a size within the above ranges, the first connecting portion CP1 may be disposed entirely in the non-emission area NEM, and thus it does not affect light emitted from the emission area EMA. In other words, when the second width WTH2 has a size within the above ranges, even if the first connecting portion CP1 includes the second connecting area CA2 having a width greater than the width of the first connecting area CA1, light emitted from the emission area EMA may not be affected by blocking or reflecting by the first connecting portion CP1. For example, the first connecting portion CP1 may not overlap either of the emission areas EMA adjacent to each other. Accordingly, it is possible to prevent a decrease in luminance of the display panel 10 (see FIG. 1).

The line width of the second sensor portion SP2 may have a fourth width WTH4. The fourth width WTH4 may refer to a width perpendicular to the direction in which the second base BS2 and the second protrusion PT2 forming the mesh pattern are extended. The first sensor portion SP1 may have substantially the same width as the second sensor portion SP2. It is, however, to be understood that the present disclosure is not limited thereto.

The fourth width WTH4 may be substantially similar to the first width WTH1. In such a case, the fourth width WTH4 may be smaller than the second width WTH2, and the relationship between the second width WTH2 and the first width WTH1 described above may be equally applied to the second width WTH2 and the fourth width WTH4. The first area CA1 of the first connecting portion CP1 may completely overlap with the first sensor portion SP1 and the second sensor portion SP2. For example, the first area CA1 of the first connecting portion CA1 may overlap the first and second protrusions PT1 and PT2. It is, however, to be understood that the present disclosure is not limited thereto.

The first sensor portion SP1 and the second sensor portion SP2 may be spaced apart from each other by a gap GP. In other words, the first protrusion PT1 of the first sensor portion SP1 and the second protrusion PT2 of the second sensor portion SP2 facing each other may be spaced apart by the gap GP. Although not limited thereto, the gap GP may be, for example, 3.5 μm, 1.0 μm to 6.0 μm, 2.0 μm to 5.0 μm, or 3.0 μm to 4.0 μm. It is, however, to be understood that the present disclosure is not limited thereto. When the gap GP is within the above ranges, the first sensor portion SP1 and the second sensor portion SP2 can be spaced apart from each other and electrically insulated from each other despite the process margin and/or misalignment. As a result, it is possible to suppress or prevent the first connecting portion CP1 thereunder from being perceived.

The second connecting area CA2 of the first connecting portion CM may be extended by a length LTH. In other words, the second connecting area CA2 of the first connecting portion CP1 may be extended by the length LTH in the second diagonal direction (e.g., the fifth direction DR5). The length LTH may be, for example, 4.5 μm, 2.0 μm to 7.0 μm, 3.0 µm to 6.0 µm, or 4.0 µm to 5.0 µm. It is, however, to be understood that the present disclosure is not limited thereto.

The length LTH of the second connecting area CA2 may be greater than the gap GP between the first sensor portion SP1 and the second sensor portion SP2. In such a case, during the process of patterning the first sensor portion SP1 and the second sensor portion SP2, the first sensor portion SP1 and the second sensor portion SP2 can be more reliably separated from each other. It is to be noted that the length LTH of the second connecting area CA2 is not limited thereto.

Hereinafter, a cross-sectional structure of the display device will be described.

Figure 10:
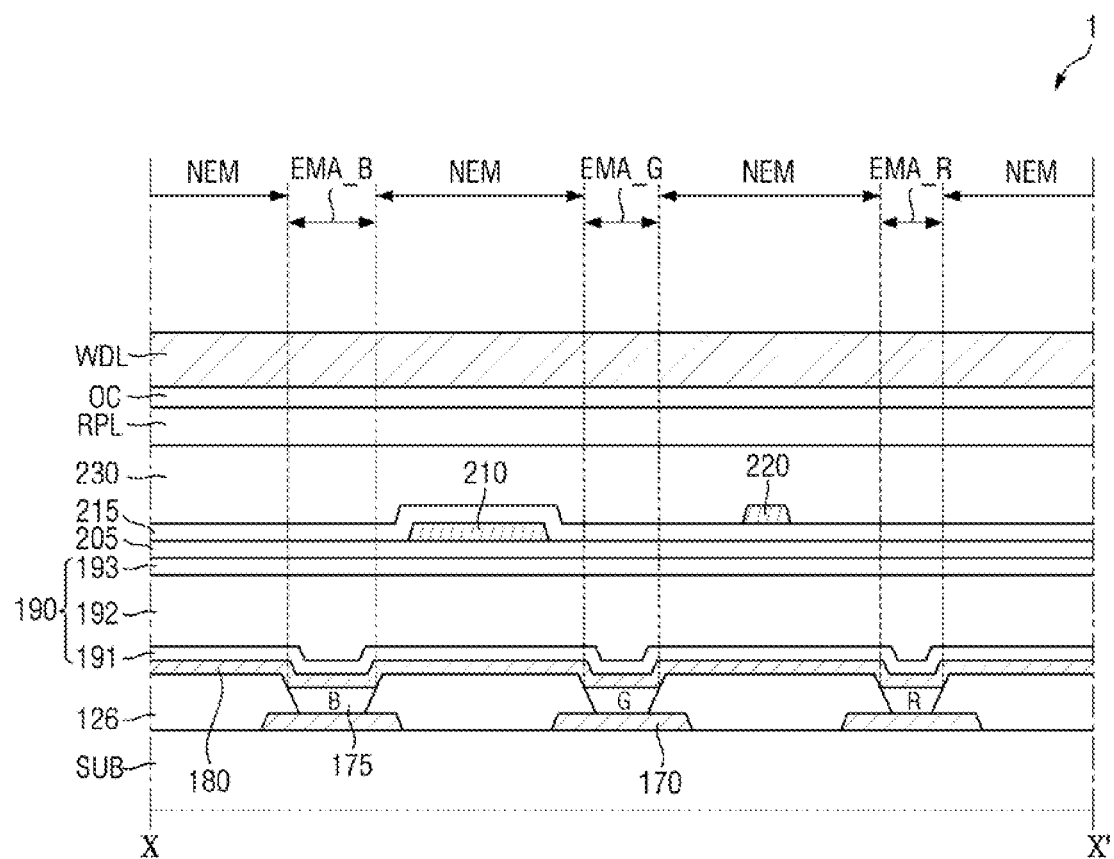
FIG. 10 is a cross-sectional view taken along, line X-X' of FIG. 7.

FIG. 10 is a cross-sectional view taken along line X-X' of FIG. 7.

Referring to FIG. 10, the substrate SUB of the display device 1 may be made of an insulating material such as a polymer resin. Examples of the polymer material may include polyethersulphone (PES), polyacrylate (PA), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The SUB may be a flexible substrate that can be bent, folded, or rolled. An example of the material of the flexible substrate may be, but is not limited to, polyimide (PI).

An anode electrode 170 is disposed on the substrate SUB. The anode electrode 170 is disposed directly on the substrate SUB for convenience of illustration. However, a plurality of thin-film transistors and signal lines may be disposed between the substrate SUB and the anode electrode 170.

The anode electrode 170 may be a pixel electrode disposed in each of the pixels. The anode electrode 170 may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. The layer having a high work function may be disposed above the reflective material layer so that it is disposed closer to an organic layer 175. The anode electrode 170 may have, but is not limited to, a multilayer structure of ITO/Mg, ITO/MgF, ITO/Ag, and ITO/Ag/ITO.

The pixel defining Liver 126 may be disposed on the substrate SUB. The pixel defining layer 126 is disposed over the anode electrode 170 and may include an opening, exposing, the anode electrode 170. The emission area EMA and the non-emission area NEM may be separated by the pixel defining layer 126 and the opening thereof. The pixel-defining layer 126 may include an organic insulating material. The pixel-defining layer 126 may include an inorganic material.

The emissive layer is disposed on the anode electrode 170 exposed via the pixel defining layer 126. The emissive layer may include an organic layer 175. The organic layer 175 may include an organic emitting layer and may further include a hole injecting/transporting layer and/or an electron injecting/transporting layer.

A cathode electrode 180 may be disposed on the organic layer 175. The cathode electrode 380 may be a common electrode disposed across the pixels. The anode electrode 170, the organic layer 175 and the cathode electrode 180 may form an organic light-emitting element.

The cathode electrode 180 may be in contact with the organic layer 175 as well as the upper surface of the pixel defining layer 126. The cathode electrode 180 may be formed conformally to the underlying features to reflect the level differences of the underlying features.

The cathode electrode 180 may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode 180 may further include a transparent metal oxide layer disposed on the material layer having a small work function.

An thin encapsulation layer 190 including a first inorganic layer 191, an organic layer 192 and a second inorganic layer 193 is disposed on the cathode electrode 180. Each of the first inorganic layer 191 and the second inorganic layer 193 may include an inorganic insulating material. The organic layer 192 may include an organic insulating material.

The touch layer TSL may be disposed on the thin-film encapsulation layer 190, and the base layer 205, the first touch conductive layer 210, the first touch insulating layer 215, the second touch conductive layer 220 and the second touch insulating layer 230 may be sequentially disposed.

The second touch conductive layer 220 may overlap with the pixel defining layer 126 and may be disposed in the non-emission area NEM. The second touch conductive layer 220 forms the mesh pattern of the sensor portions and does not interfere with emission of light and is not seen by a viewer because it does not overlap with the emission area EMA.

The anti-reflection layer RPL is disposed on the second touch insulating layer 230, and the protective layer WDL is disposed on the anti-reflection layer RPL. An adhesive layer OC may be further disposed between the anti-reflection layer RPL and the protective layer WDL. The anti-reflection layer RPL and the protective layer WDL may be attached together by the adhesive layer OC. The adhesive layer OC may be optically transparent. The adhesive layer OC may include, for example, a transparent adhesive member such as an optically clear adhesive (OCA) film and an optically clear resin (OCR).

When the anti-reflection layer RPL is implemented as a polarizing film, a low-refractive film, the anti-reflection layer RPL and the adhesive layer OC may include substantially the same refractive index, and thus it is possible to suppress or prevent refraction or total reflection at the boundaries of the elements. As a result, light emission efficiency can be improved, and reflection of external light can be reduced.

Hereinafter, other embodiments of the present disclosure will be described. In the following description, the same or similar elements will be denoted by the same or similar reference numerals, and redundant descriptions will be omitted or briefly described. Descriptions will be made focusing on differences from the above embodiment.

Figure 11:
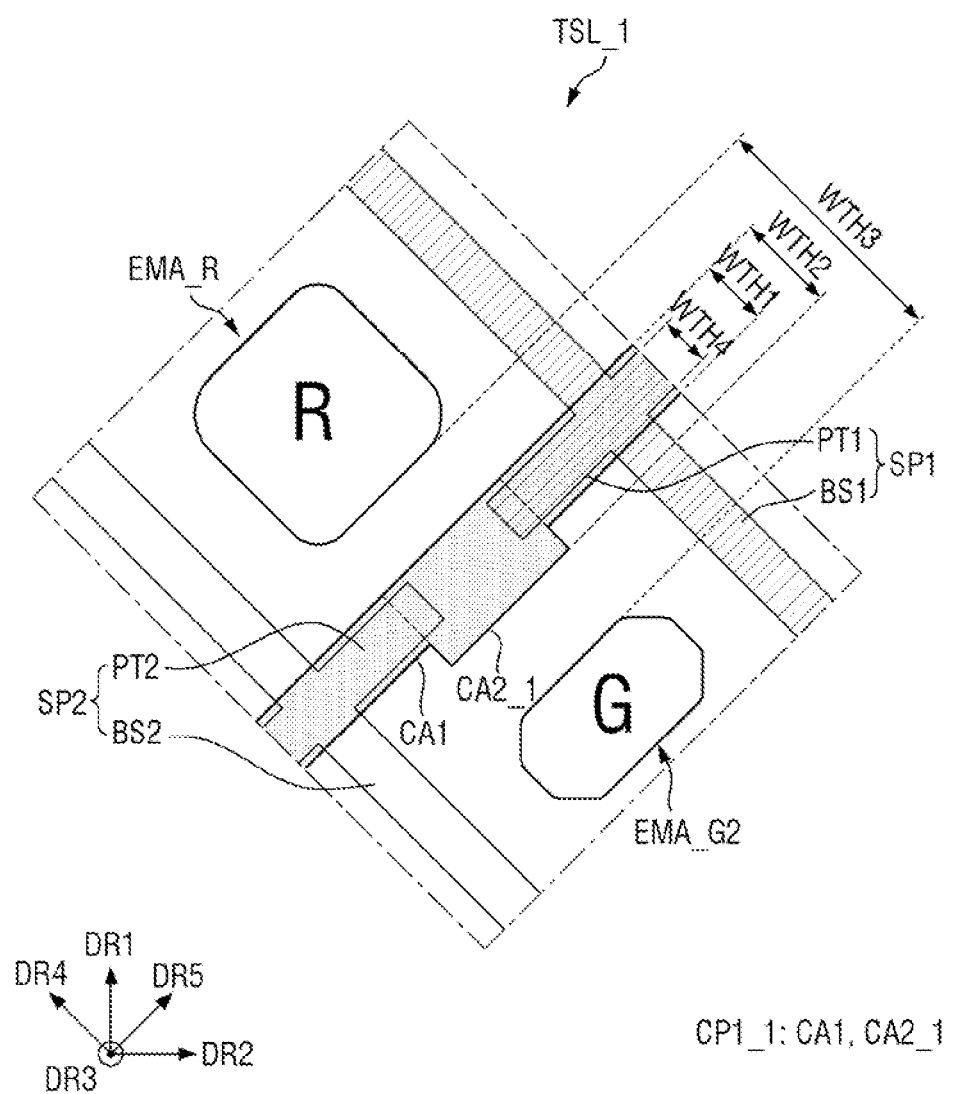
FIG. 11 is an enlarged plan view showing a part of a touch member according to another embodiment of the present disclosure.

FIG. 11 is an enlarged plan view showing a part of a touch member according to another embodiment of the present disclosure.

The embodiment of FIG. 11 is different from the embodiment of FIG. 9 in that a second connecting area CA2_1 of a first connecting portion CP1_1 in a touch layer TSL_1 includes a shape protruding in a direction perpendicular to the extension direction. For example, the second connecting area CA2_1 extended in the second diagonal direction (e.g., the fifth direction DR5) may have a shape protruding toward one side in the first diagonal direction (e.g., the fourth direction DR4). In this case, the second connecting area CA2_1 may protrude into the non-emission area adjacent to the emission area EMA_G2 of a third color pixel.

Also in this instance, the first sensor portion SP1 and the second sensor portion SP2 can be patterned and spaced apart from each other reliably, and the first sensor portion SP1 and the second sensor portion SP2 can be reliably electrically insulated from each other. In addition, even if the gaps between the emission areas EMA (see FIG. 7) are different, the first sensor portion SN and the second sensor portion SP2 can be patterned reliably by employing a variety of shapes of the second connecting area CA2_1.

Figure 12:
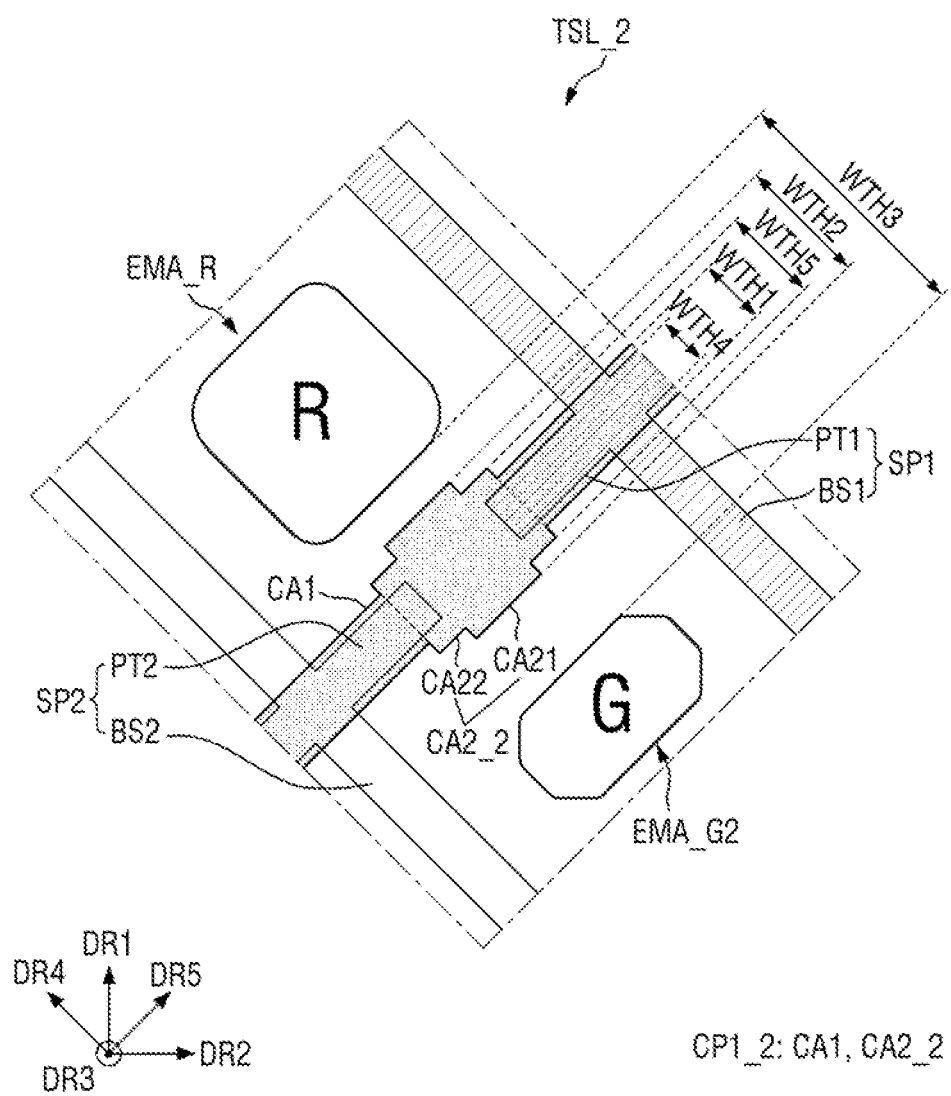
FIG. 12 is an enlarged plan view showing a part of a touch member according to yet another embodiment of the present disclosure.

FIG. 12 is an enlarged plan view showing a part of a touch member according to yet another embodiment of the present disclosure.

The embodiment of FIG. 12 is different from the embodiment of FIG. 9 in that a second connecting area CA2_2 of a first connecting portion CP1_2 in a touch layer TSL_2 includes a first sub-connecting area CA21 and a second sub-connecting area CA22 having different widths. The first sub-connecting area CA21 may include a second width and the second sub-connecting area CA22 may include a fifth width WHT5. The fifth width WHT5 may be smaller than the second width WTH2 and greater than the fourth width WHT4 of the first sensor portion SP1. The second sub-connecting area CA22 may be disposed between the first sub-connecting area CA21 and the first connection area CA1.

Also in this instance, the first sensor portion SP1 and the second sensor portion SP2 can be patterned and spaced apart from each other reliably, and the first sensor portion SP1 and the second sensor portion SP2 can be reliably electrically insulated from each other. In addition, by employing a variety of shapes of the second connecting area CA2_2, the first sensor portion SP1 and the second sensor portion SP2 can be more reliably patterned.

Figure 13:
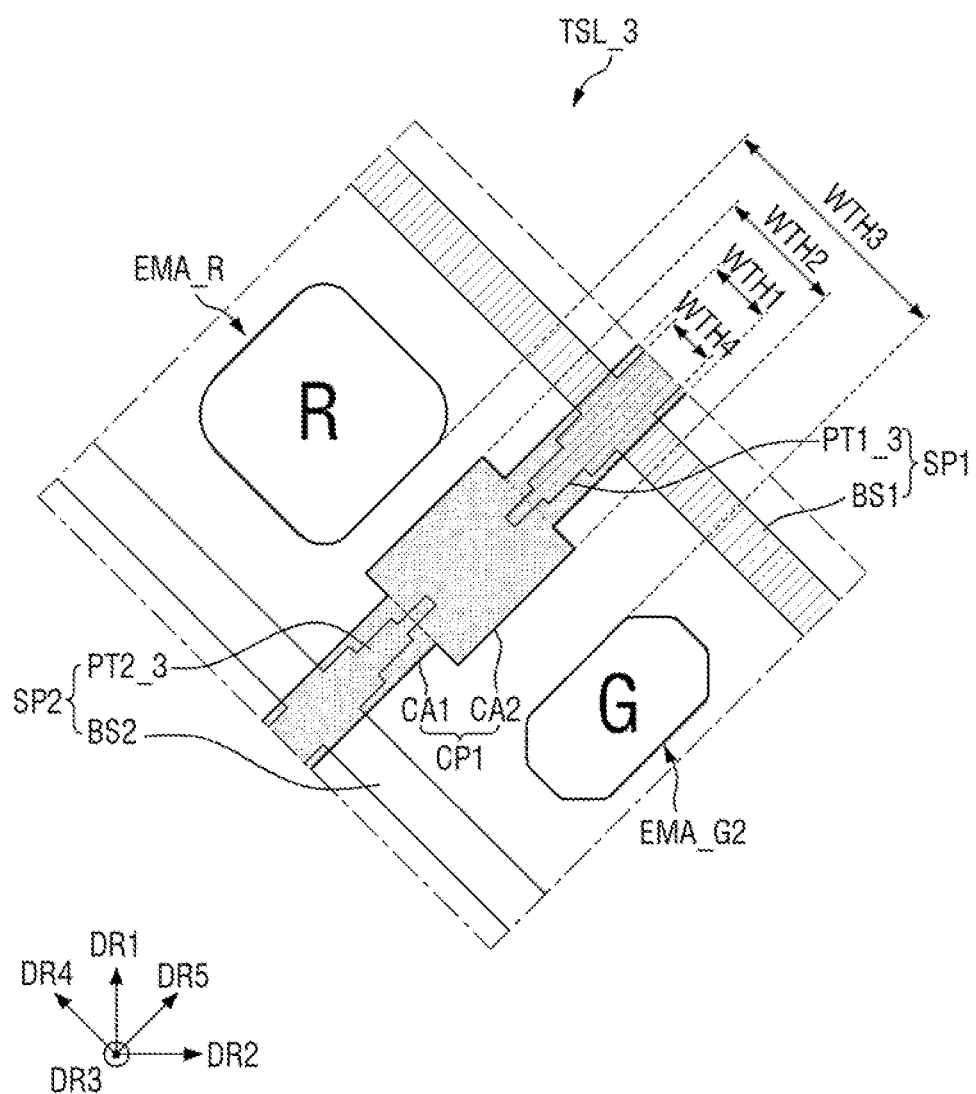
FIG. 13 is an enlarged plan view showing a part of a touch member according to yet another embodiment of the present disclosure.

FIG. 13 is an enlarged plan view showing a part of a touch member according to yet another embodiment of the present disclosure.

The embodiment of FIG. 13 is different from the embodiment of FIG. 9 in that the width of each of a first protrusion PT1_3 of a first sensor portion SP1 and a second protrusion PT2_3 of a second sensor portion SP2 in a touch layer TSL_3 decreases toward a second connecting area CA2 of a first connecting portion CP1. In other words, in the first protrusion PT1_3 of the first sensor portion SP1 and the second protrusion PT2_3 of the second sensor unit SP2 in the touch layer TSL_3 facing each other, the width of the first protrusion PT1_3 of the first sensor portion SP1 may decrease toward the second protrusion PT2_3 of the second sensor portion SP2, and the width of the second protrusion PT2_3 of the second sensor portion SP2 may decrease toward the first protrusion PT1_3 of the first sensor portion SP1. In other words, the width of the first protrusion PT1_3 and the width of the second protrusion PT2_3 may decrease as they approach the gap.

It is, however, to be understood that the present disclosure is not limited thereto. When the widths of the first protrusions PT1_3 and the second protrusions PT2_3 facing each other decrease toward each other, the first connecting portion CP1 may not include the second connecting area CA2 but may just include the first connecting area CA1.

Also in this instance, the first sensor portion SN and the second sensor portion SP2 can be patterned and spaced apart from each other reliably, and the first sensor portion SP1 and the second sensor portion SP2 can be reliably electrically insulated from each other. In addition, as the widths of the first protrusion PT1_3 of the first sensor portion SP1 and the second protrusion PT2_3 of the second sensor portion SP2 decrease toward the second connecting area CA2 of the first connecting portion CP1, the first sensor portion SP1 and the second sensor portion SP2 can be patterned reliably.

Figure 14:
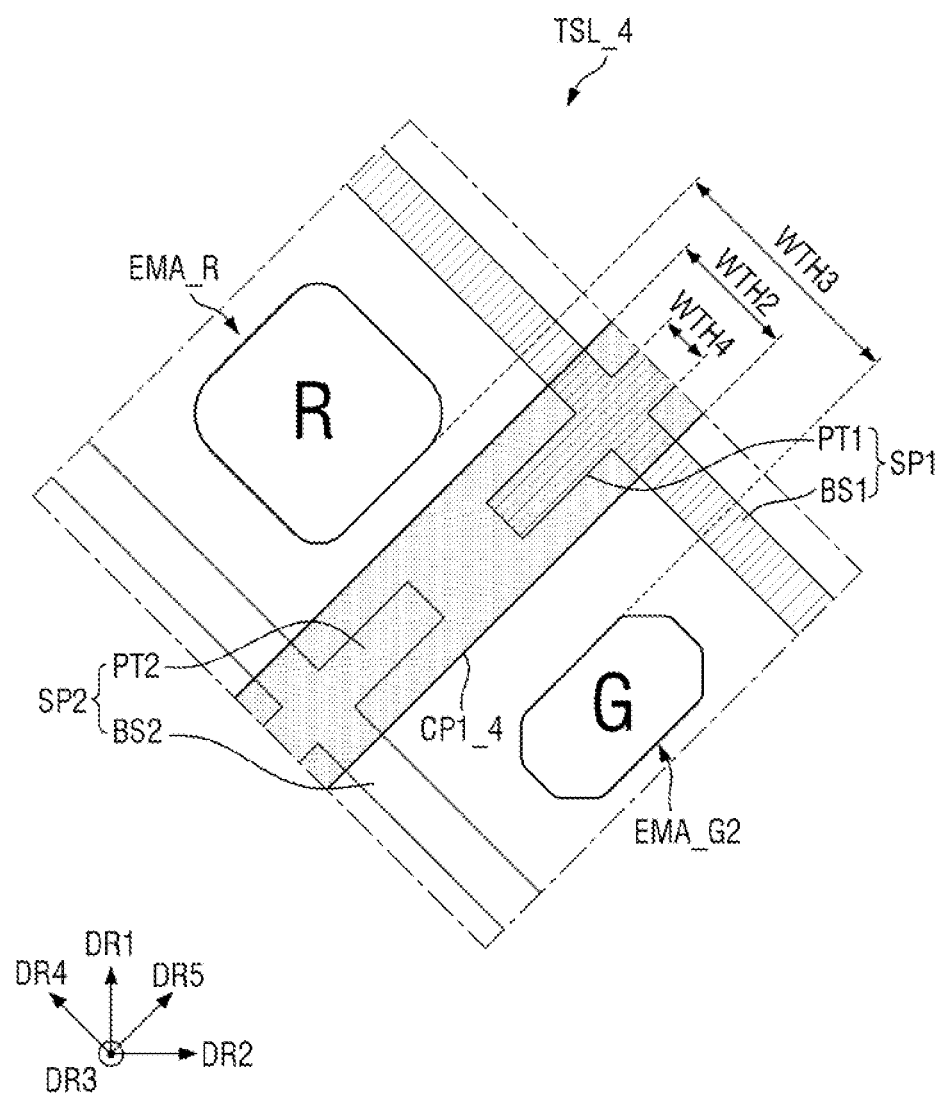
FIG. 14 is an enlarged plan view showing a part of a touch member according to yet another embodiment of the present disclosure.

FIG. 14 is an enlarged plan view showing a part of a touch member according to yet another embodiment of the present disclosure.

The embodiment of FIG. 14 is different from the embodiment of FIG. 9 in that a first connecting portion CP1_4 in a touch layer TSL_4 has substantially uniform width. The first connecting portion CP1_4 may include a second width WHT2 in the entire area. The second width WHT2 according to this embodiment may be substantially equal to the second width WTH2 of the second connecting area CA2 of the first connecting portion CP1 of FIG. 9 described above.

Also in this instance, the first sensor portion SP1 and the second sensor portion SP2 can be patterned and spaced apart from each other reliably, and the first sensor portion SP1 and the second sensor portion SP2 can be reliably electrically insulated from each other. In addition, by employing a variety of shapes of the first connecting portion CP1_4, the first sensor portion SP1 and the second sensor portion SP2 can be reliably patterned.

Figure 15:
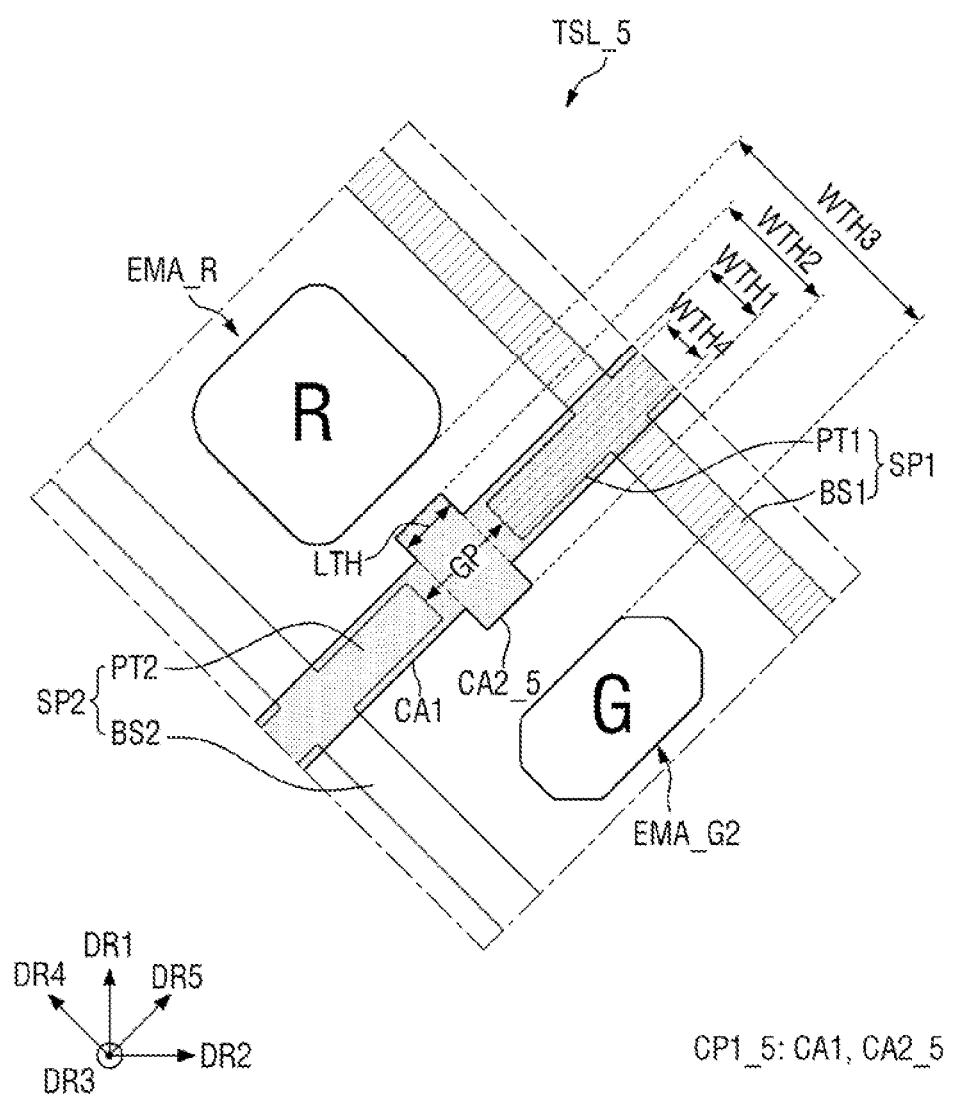
FIG. 15 is an enlarged plan view showing a part of a touch member according to yet another embodiment of the present disclosure.

FIG. 15 is an enlarged plan view showing aa part of a touch member according to yet another embodiment of the present disclosure.

The embodiment of FIG. 15 is different from the embodiment of FIG. 9 in that a length LTH of a second connecting area CA2_5 of a first connecting portion CP1_5 in a touch layer TSL_5 may be smaller than a gap GP between a first sensor portion SP1 and a second sensor portion SP2. In such a case, the second connecting area CA2_5 of the first connecting portion CP1_5 may overlap with neither the first sensor portion SP1 nor the second sensor portion SP2.

Also in this instance, the first sensor portion SP1 and the second sensor portion SP2 can be patterned and spaced apart from each other reliably, and the first sensor portion SP1 and the second sensor portion SP2 can be reliably electrically insulated from each other. In addition, by employing a variety of shapes of the first connecting portion CP1_5, the first sensor portion SP1 and the second sensor portion SP2 can be more reliably patterned.

Figure 16:
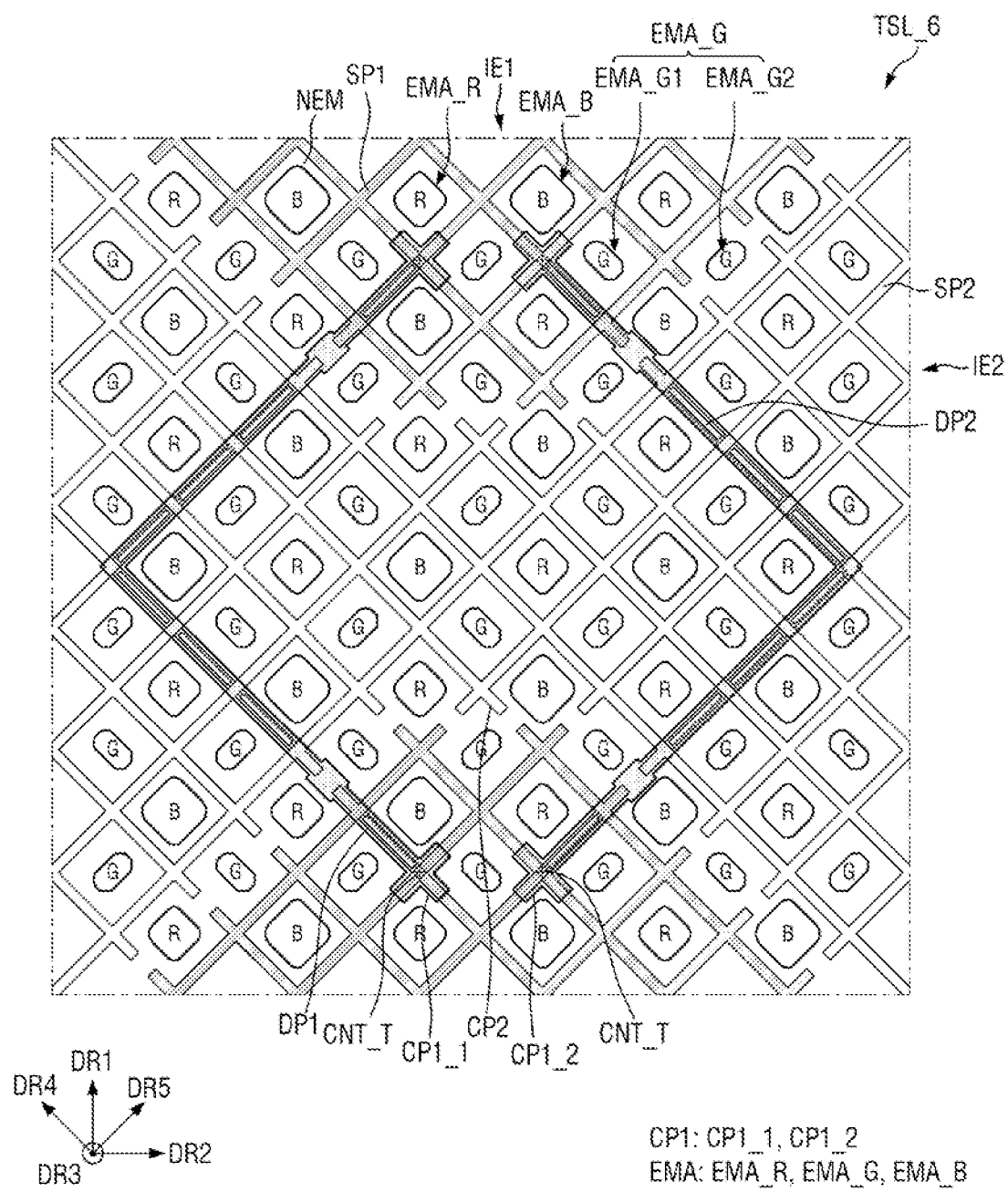
FIG. 16 is an enlarged plan view showing a part of a touch member according to yet another embodiment of the present disclosure.

FIG. 16 is an enlarged plan view showing a part of a touch member according to yet another embodiment of the present disclosure.

The embodiment of FIG. 16 is different from the embodiment of FIG. 7 in that a touch layer TSL_6 further includes a first touch dummy pattern DP1 and a second touch dummy pattern DP2.

The first touch dummy pattern DP1 and the second touch dummy pattern DP2 may be spaced apart from the first sensor portion SP1 and the second sensor portion SP2, and may have an island shape. The first touch dummy pattern DP1 and the second touch dummy pattern DP2 may be electrically insulated from the first sensor portion SP1 and the second sensor portion SP2. The first touch dummy pattern DP1 may be surrounded by the first sensor portion SP1, and the second touch dummy pattern DP2 may be surrounded by the second sensor portion SP2. It is, however, to be understood that the present disclosure is not limited thereto.

The first touch dummy pattern DP1 and the second touch dummy pattern DP2 may be formed as the second touch conductive layer 220 (see FIG. 6). The first touch dummy pattern DP1 and the second touch dummy pattern DP2 may overlap with the first connecting portion CP1. In addition, a second connecting area CA2 of a first connecting portion CP1 may be disposed around one end and/or the opposite end of the first touch dummy pattern DP1 and the second touch dummy pattern DP2.

Also in this instance, the first sensor portion SP1 and the second sensor portion SP2 can be patterned and spaced apart from each other reliably, and the first sensor portion SP1 and the second sensor portion SP2 can be reliably electrically insulated from each other. In addition, the portions overlapping the first connecting portion CP1 the first touch dummy pattern DP1 and the second touch dummy pattern DP2) are electrically insulated from the first sensor portion SP1 and the second sensor portion SP2, thus it is possible to suppress or prevent defects due to mutual interference.

It is to be understood, those skilled in the art will appreciate that many variations and modifications can be made to the disclosed embodiments without departing from the scope of the present disclosure. Therefore, the disclosed embodiments are used in a descriptive sense and are not limiting.

What is claimed is:

1. A display device, comprising:
    a display panel; and
    a touch member disposed on the display panel and comprising a first touch conductive layer, a second touch conductive layer, and a first touch insulating film interposed between the first touch conductive layer and the second touch conductive layer,
    wherein the first touch conductive layer comprises a first touch connection pattern comprising a first connecting area and a second connecting area having a larger width than a width of the first connecting area, the first connecting area and the second connecting area are disposed on a same layer and provided in an integrated form,
    wherein the width of the first connecting area and the width of the second connecting area are measured in a same direction,
    wherein the second touch conductive layer comprises a plurality of first touch sensor patterns electrically connected by the first touch connection pattern, a plurality of second touch sensor patterns electrically insulated from the plurality of first touch sensor patterns, and a second touch connection pattern electrically connecting the plurality of second touch sensor patterns with one another, and
    wherein the second connecting area of the first touch connection pattern is disposed between the first touch sensor pattern and the second touch sensor pattern that face each other.

2. The display device of claim 1, wherein the first connecting area has a first width, and the second connecting area has a second width, and wherein the second width is in a range of 1.1 to 10 times the first width.

3. The display device of claim 2, Wherein the first width is in a range of 1.0 µm to 5.0 µm, and the second width is in a range of 2.0 µm to 10.0 µm.

4. The display device of claim 1, wherein the first touch sensor pattern, the second touch sensor pattern and the second touch connection pattern form a mesh pattern.

5. The display device of claim 4, further comprising:
    a plurality of emission areas for emitting light; and
    a non-emission area surrounding the plurality of emission areas,
    wherein the first touch connection pattern, the first touch sensor pattern, the second touch sensor pattern, and the second touch connection pattern are disposed in the non-emission area.

6. The display device of claim 5, wherein the emission areas comprises a first emission area and a second emission area that emit lights of different colors and are adjacent to each other, and wherein a width of the non-emission area disposed between the first emission area and the second emission area is larger than a width of the second connecting area.

7. The display device of claim 4, wherein a width of the first touch sensor pattern and a width of the second touch sensor pattern are smaller than a width of the second connecting area of the first touch connection pattern.

8. The display device of claim 1, wherein the first touch sensor pattern comprises a first base and a first protrusion protruding from the first base toward the second touch sensor pattern, wherein the second touch sensor pattern comprises a second base and a second protrusion protruding from the second base toward the first touch sensor pattern, and wherein the first protrusion and the second protrusion face each other.

9. The display device of claim 8, wherein the second connecting area of the first touch connection pattern is disposed in an area where the first protrusion and the second protrusion face each other.

10. The display device of claim 9, wherein a width of each of the first protrusion and the second protrusion becomes narrower as the first protrusion and the second protrusion approach each other.

11. The display device of claim 9, wherein a distance between the first protrusion and the second protrusion is greater than a length of the second connecting area of the first touch connection pattern.

12. The display device of claim 1, wherein the plurality of second touch sensor patterns and the second touch connection pattern are formed integrally, and wherein the first touch sensor patterns are electrically separated and electrically insulated from one another, with the second touch connection pattern therebetween.

13. The display device of claim 12, wherein the first touch sensor patterns are arranged along a first direction, and the second touch sensor patterns are arranged along a second direction perpendicular to the first direction.

14. The display device of claim 13, further comprising:
    a touch driving line electrically connected to the plurality of first touch sensor patterns; and
    a touch sensing line electrically connected to the plurality of second touch sensor patterns.

15. A display device, comprising:
    a display panel comprising a plurality of emission areas for emitting light and a non-emission area surrounding the plurality of emission areas; and
    a touch member disposed on the display panel and comprising a first touch sensor pattern, a second touch sensor pattern separated from the first touch sensor pattern and facing the first touch sensor pattern, and a first touch connection pattern disposed between the first touch sensor pattern and the second touch sensor pattern,
    wherein the first touch sensor pattern, the second touch sensor pattern and the first touch connection pattern are disposed in the non-emission area,
    wherein a width of the first touch connection pattern is greater than a width of the first touch sensor pattern and a width of the second touch sensor pattern, and is smaller than a width of the non-emission area located between two adjacent emission areas of the plurality of emission areas, wherein the first touch connection pattern comprises a first touch connection pattern comprising a first connecting area and a second connecting area having a larger width than a width of the first connecting area,
wherein a first portion of the first connecting area overlaps the first touch sensor pattern and a second portion of the first connecting area overlaps the second touch sensor pattern, the second connecting area is disposed between the first and second portions such that a straight line is formed through the first portion, the second connecting area, and the second portion.

16. The display device of claim 15, wherein the first touch sensor pattern and the second touch sensor pattern form a mesh pattern.

17. The display device of claim 16, wherein the first touch connection pattern is included in a first touch conductive layer, and the first touch sensor pattern and the second touch sensor pattern are included in a second touch conductive layer different from the first touch conductive layer.

18. The display device of claim 17, wherein the second touch conductive layer further comprises a second touch connection pattern,
wherein the first touch sensor pattern comprises a plurality of first touch sensors, and the second touch sensor pattern comprises a plurality of second touch sensors, and
wherein the first touch sensors are electrically connected with one another by the first touch connection pattern, and the second touch sensors are electrically connected with one another by the second touch connection pattern.

19. The display device of claim 15, wherein the second connecting area is disposed between the first touch sensor pattern and the second touch sensor pattern.

20. The display device of claim 19, wherein the width of the second connecting area is in a range of 1.1 to 10 times the width of the first connecting area.

* * * * *